(12) United States Patent
Fuchiwaki

(10) Patent No.: US 10,673,000 B2
(45) Date of Patent: Jun. 2, 2020

(54) HETEROCYCLIC COMPOUND AND ORGANIC ELECTROLUMINESCENCE DEVICE INCLUDING THE SAME

(71) Applicant: SAMSUNG DISPLAY CO., LTD., Yongin-si, Gyeonggi-do (KR)

(72) Inventor: Junta Fuchiwaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 15/801,647

(22) Filed: Nov. 2, 2017

(65) Prior Publication Data
US 2018/0138429 A1 May 17, 2018

(30) Foreign Application Priority Data
Nov. 14, 2016 (KR) .................. 10-2016-0151396

(51) Int. Cl.
*H01L 51/50* (2006.01)
*H01L 51/00* (2006.01)
(Continued)

(52) U.S. Cl.
CPC ........ *H01L 51/0094* (2013.01); *C07F 7/0816* (2013.01); *C09K 11/06* (2013.01); *H01L 51/0067* (2013.01); *H01L 51/0071* (2013.01); *H01L 51/0072* (2013.01); *H01L 51/0073* (2013.01); *H01L 51/0074* (2013.01); *C09K 2211/1018* (2013.01); *H01L 51/5012* (2013.01); *H01L 51/5016* (2013.01);
(Continued)

(58) Field of Classification Search
None
See application file for complete search history.

(56) References Cited

U.S. PATENT DOCUMENTS

2010/0171417 A1 7/2010 Kitamura et al.
2016/0005978 A1 1/2016 Sagara et al.
(Continued)

FOREIGN PATENT DOCUMENTS

KR 10-2006-0032930 A 4/2006
KR 10-2010-0048447 A 5/2010
(Continued)

*Primary Examiner* — Gregory D Clark
(74) *Attorney, Agent, or Firm* — Lewis Roca Rothgerber Christie LLP

(57) ABSTRACT

A heterocyclic compound and an organic electroluminescence device including the same, the heterocyclic compound being represented by Formula 1:

[Formula 1]

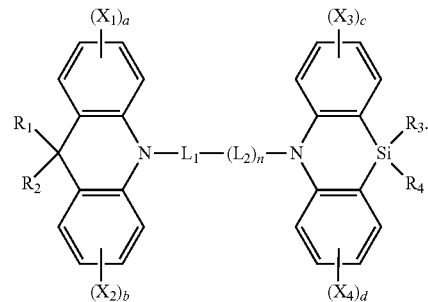

20 Claims, 2 Drawing Sheets

(51) Int. Cl.
*C07F 7/08* (2006.01)
*C09K 11/06* (2006.01)
*H01L 51/52* (2006.01)

(52) U.S. Cl.
CPC ...... *H01L 51/5056* (2013.01); *H01L 51/5064* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01)

(56) References Cited

U.S. PATENT DOCUMENTS

2016/0172600 A1    6/2016    MacDonald et al.
2017/0256723 A1*    9/2017    Wang ................. H01L 51/0072

FOREIGN PATENT DOCUMENTS

| | | | | |
|---|---|---|---|---|
| KR | 10-2013-0096647 A | | 8/2013 | |
| KR | 10-2014-0000639 | * | 1/2014 | ............ H01L 51/50 |
| KR | 10-2014-0000639 A | | 1/2014 | |
| KR | 10-2015-0120489 A | | 10/2015 | |
| KR | 10-2016-0035062 A | | 3/2016 | |
| WO | WO 2007/110228 A1 | | 4/2007 | |
| WO | WO 2010/050778 A1 | | 6/2010 | |
| WO | WO 2010/050781 A1 | | 6/2010 | |
| WO | WO 2015/068987 A1 | | 5/2015 | |

* cited by examiner

HETEROCYCLIC COMPOUND AND ORGANIC ELECTROLUMINESCENCE DEVICE INCLUDING THE SAME

CROSS-REFERENCE TO RELATED APPLICATIONS

Korean Patent Application No. 10-2016-0151396, filed on Nov. 14, 2016, in the Korean Intellectual Property Office, and entitled: "Heterocyclic Compound And Organic Electroluminescence Device Including The Same," is incorporated by reference herein in its entirety.

BACKGROUND

1. Field

Embodiments relate to a heterocyclic compound and an organic electroluminescence device including the same.

2. Description of the Related Art

Development on an organic electroluminescence display as an image display is being actively conducted. An organic electroluminescence display is different from a liquid crystal display and is a self-luminescent display which accomplishes display by recombining holes and electrons injected from a first electrode and a second electrode in an emission layer and emitting light from a luminescent material which is an organic compound included in the emission layer.

An organic electroluminescence device may include, e.g., an organic device composed of a first electrode, a hole transport layer disposed on the first electrode, an emission layer disposed on the hole transport layer, an electron transport layer disposed on the emission layer, and a second electrode disposed on the electron transport layer. Holes are injected from the first electrode, and the injected holes move via the hole transport layer to be injected into the emission layer. Meanwhile, electrons are injected from the second electrode, and the injected electrons move via the electron transport layer to be injected into the emission layer. By recombining the holes and electrons injected into the emission layer, excitons are generated in the emission layer. The organic electroluminescence device emits light using light emitted during the transition of the excitons back to a ground state.

SUMMARY

Embodiments are directed to a heterocyclic compound and an organic electroluminescence device including the same.

The embodiments may be realized by providing a heterocyclic compound represented by the following Formula 1:

[Formula 1]

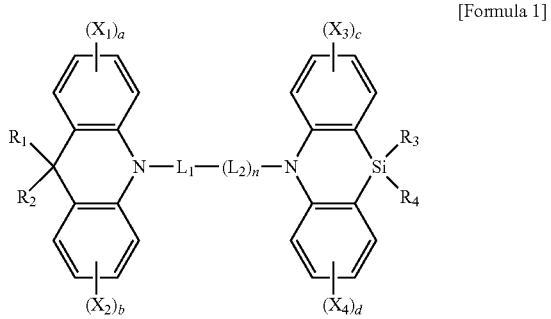

wherein in Formula 1, $L_1$ and $L_2$ are each independently a substituted or unsubstituted arylene group having 6 to 30 ring carbon atoms or a substituted or unsubstituted heteroarylene group having 2 to 30 ring carbon atoms, n is 0 or 1, $R_1$ to $R_4$ and $X_1$ to $X_4$ are each independently a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ and $X_1$ to $X_4$ being separate or forming a ring by combining adjacent groups with each other, and a to d are each independently an integer of 0 to 4.

$R_1$ to $R_4$ may each independently be a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

At least two of $R_1$ to $R_4$ may be a substituted or unsubstituted aryl group having 6 to 30 ring carbon atoms.

The compound represented by Formula 1 may be represented by the following Formula 1-1:

[Formula 1-1]

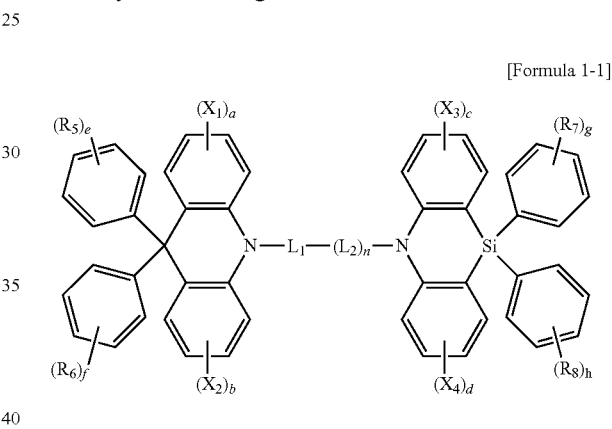

wherein in Formula 1-1, $R_5$ to $R_8$ are each independently a hydrogen atom, a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms, e to h are each independently an integer of 0 to 4, and $L_1$, $L_2$, $X_1$ to $X_4$, a to d, and n are defined the same as those of Formula 1.

$L_1$ may be a substituted or unsubstituted phenylene group, a substituted or unsubstituted divalent biphenyl group, a substituted or unsubstituted divalent terphenyl group, a substituted or unsubstituted fluorenylene group, or a heteroarylene group having at least one nitrogen atom (N) as a heteroatom.

n may be 0.

n may be 1, $L_1$ may be a substituted or unsubstituted arylene group having 6 to 30 ring carbon atoms, and $L_2$ may be a substituted or unsubstituted heteroarylene group having 2 to 30 ring carbon atoms.

$L_2$ may be a substituted or unsubstituted carbazole group, a substituted or unsubstituted dibenzofuran group, or a substituted or unsubstituted dibenzothiophene group.

$L_1$ may be a group represented by one of the following Formulae $L_{1-1}$ to $L_{1-11}$:

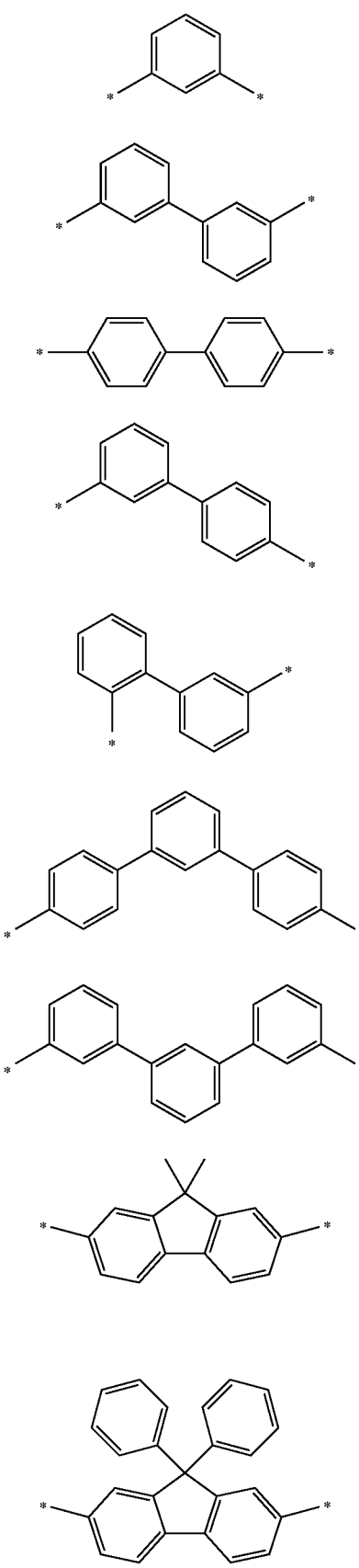

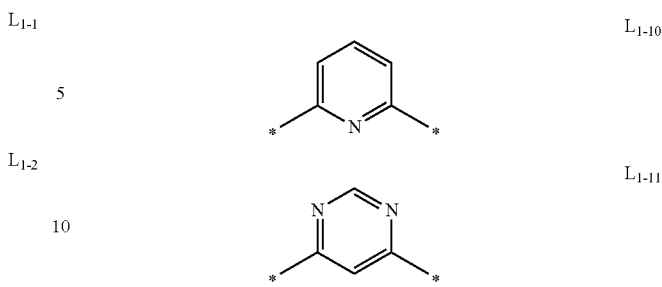

wherein Formulae $L_{1-1}$ to $L_{1-11}$ are each independently unsubstituted or substituted with a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms.

The heterocyclic compound represented by Formula 1 may be a compound of the following Compound Group 1:

[Compound Group 1]

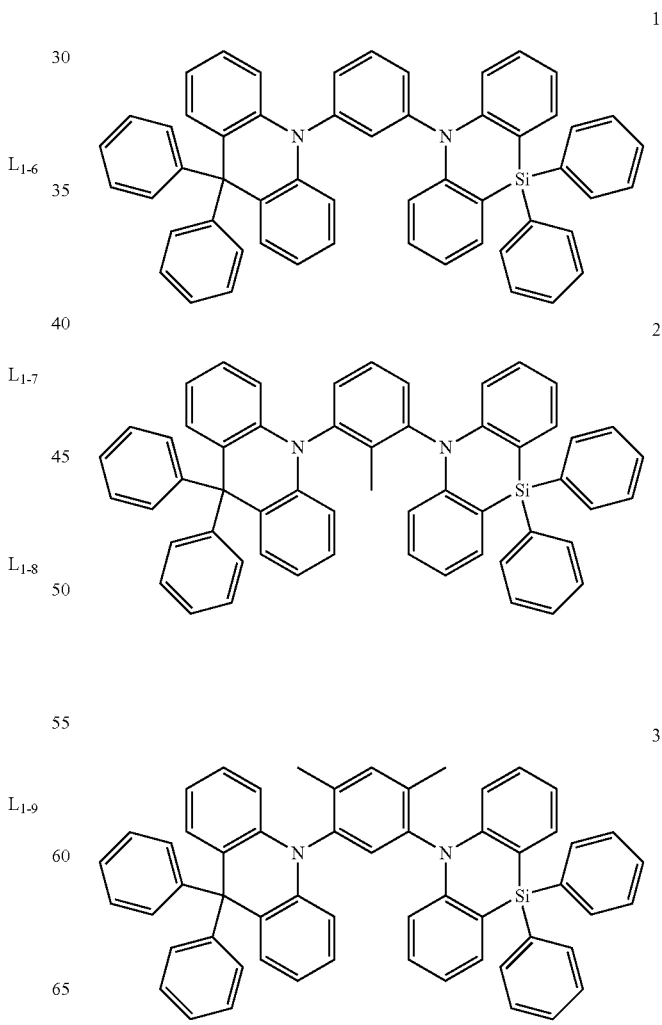

4
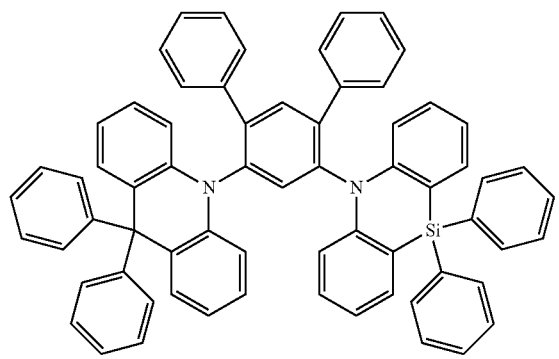
5
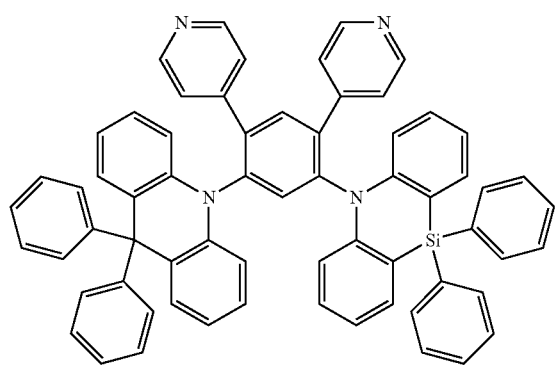
6
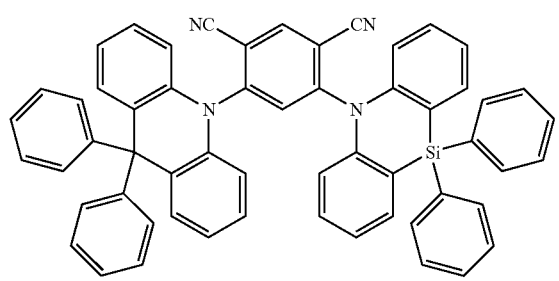
7
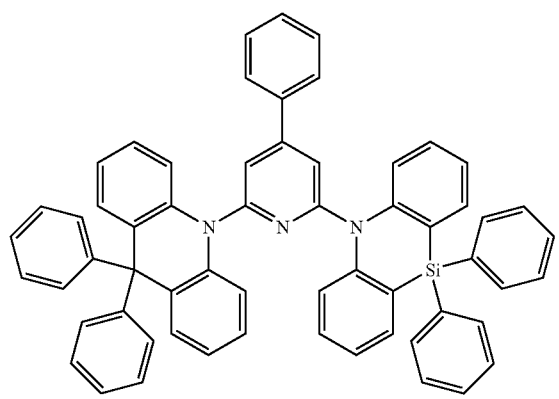
8
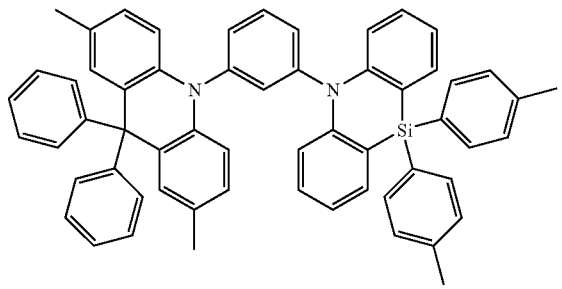
9
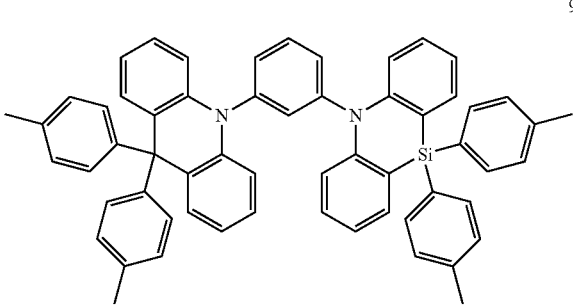
10
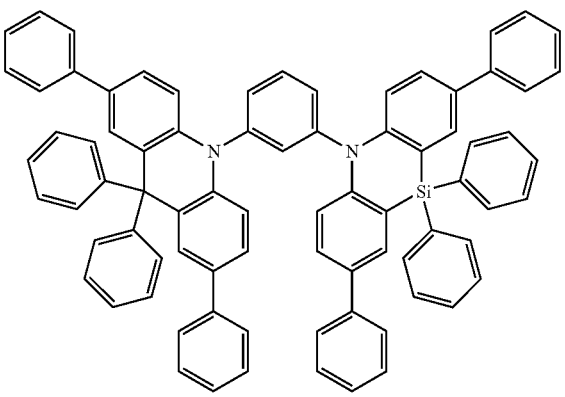
11
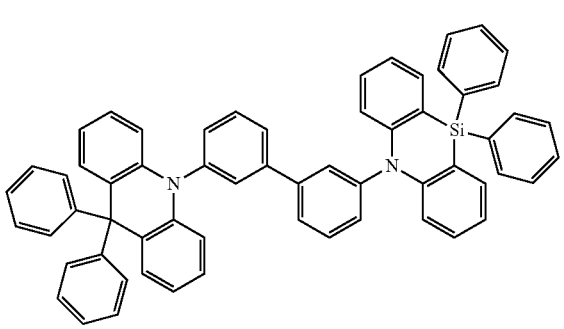

12
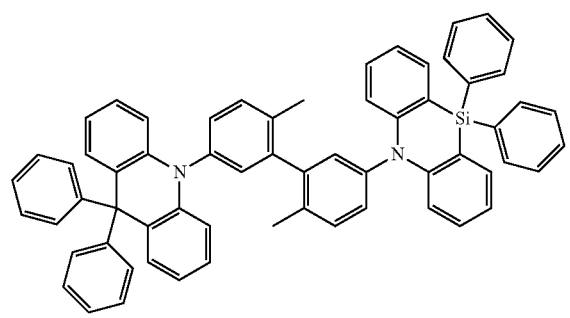
13
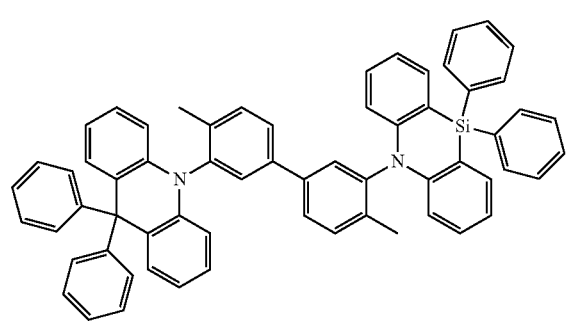
14
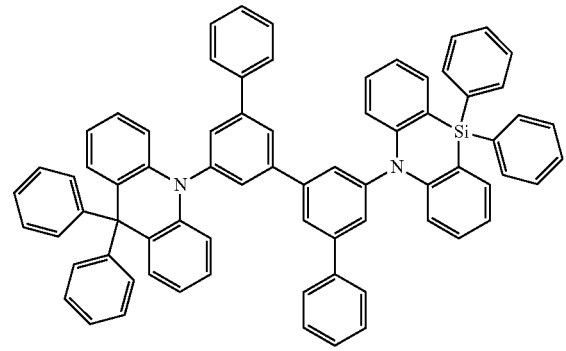
15
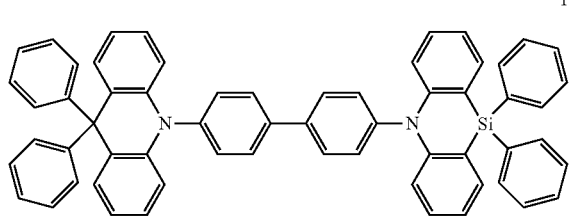
16
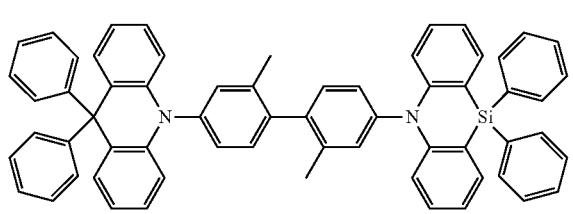
17
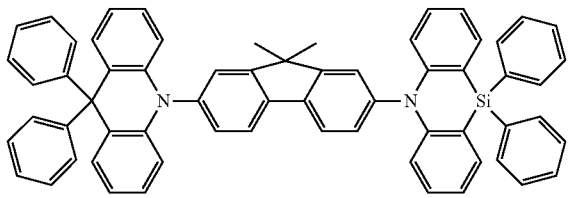
18
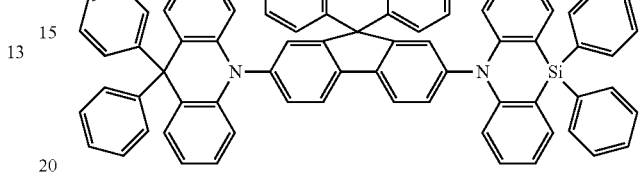
19
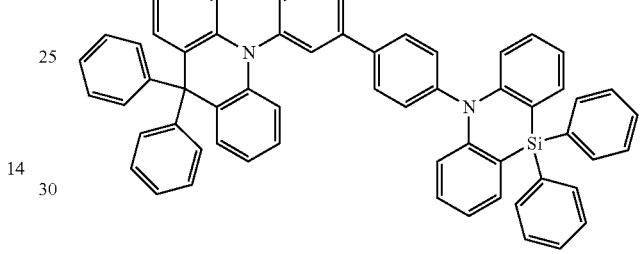
20
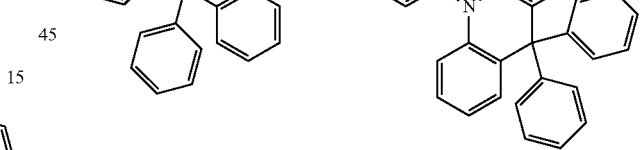
21
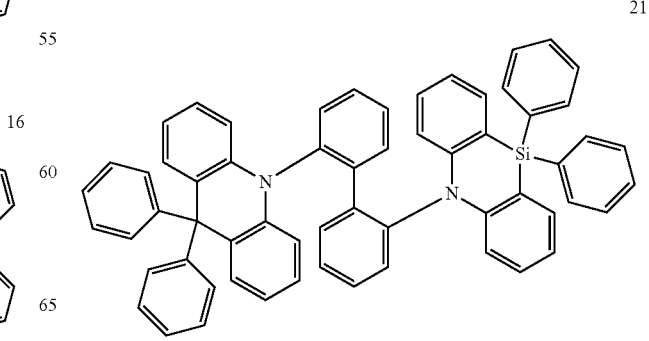

22
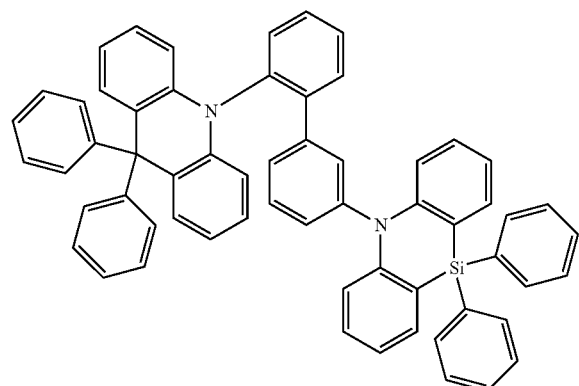
23
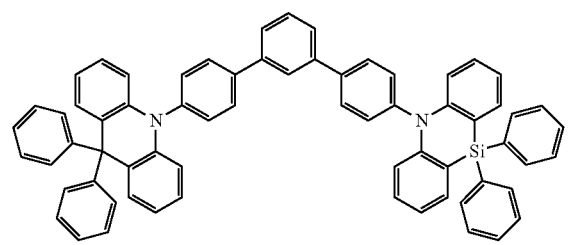
24
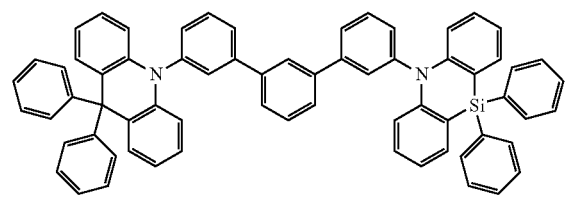
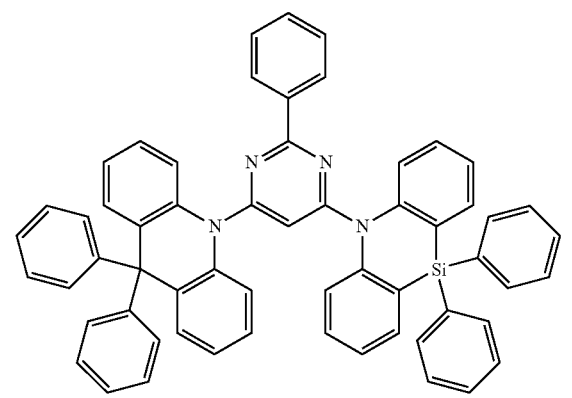
26
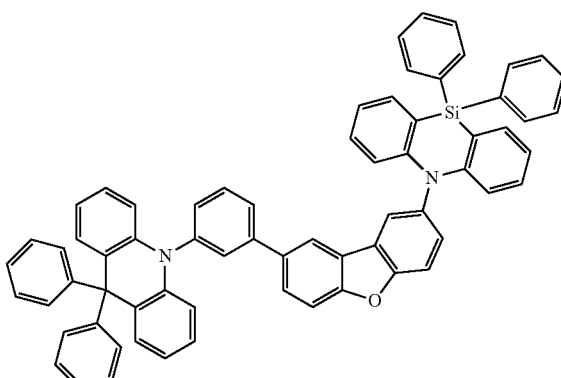
27
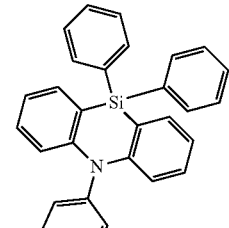
28
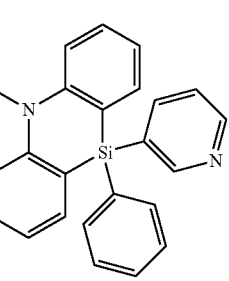
29

30
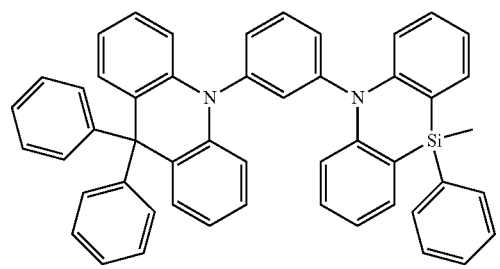
31
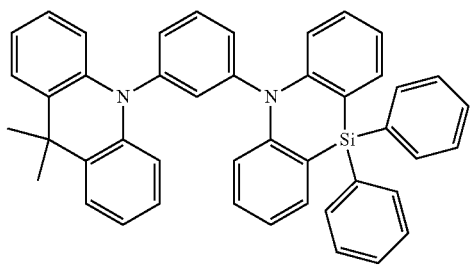
32
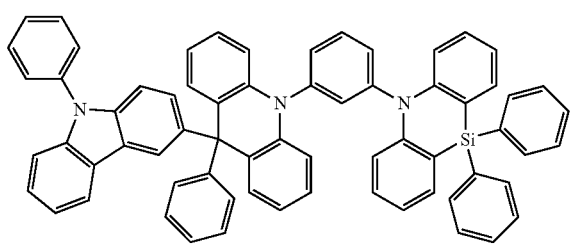
33
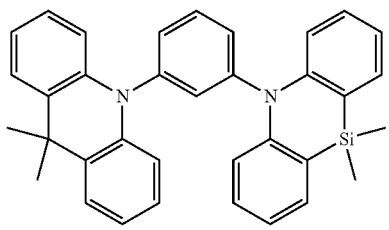
34
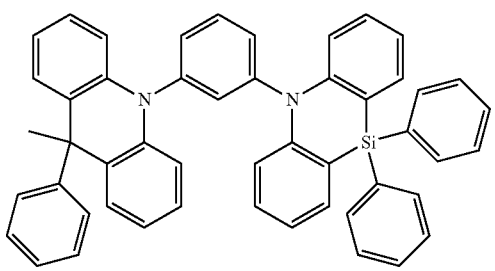
35
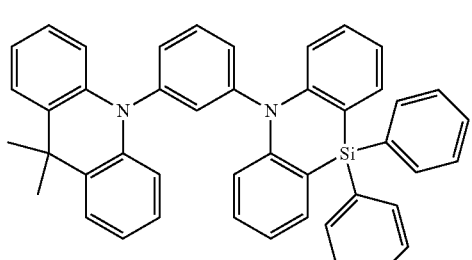
36
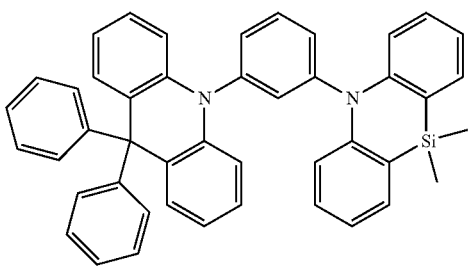
37
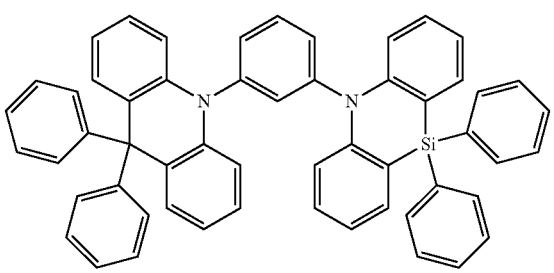
38
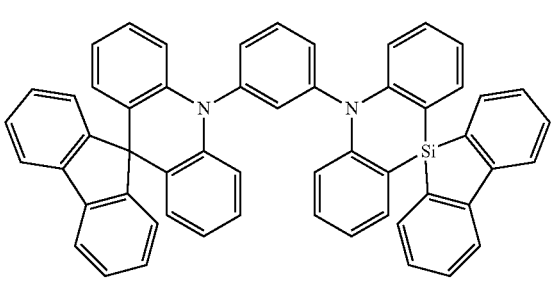
39
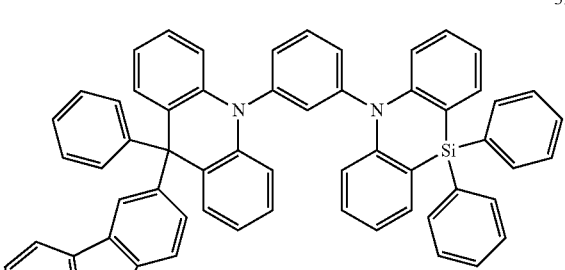
40
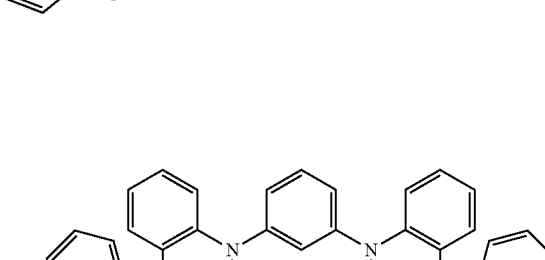

-continued

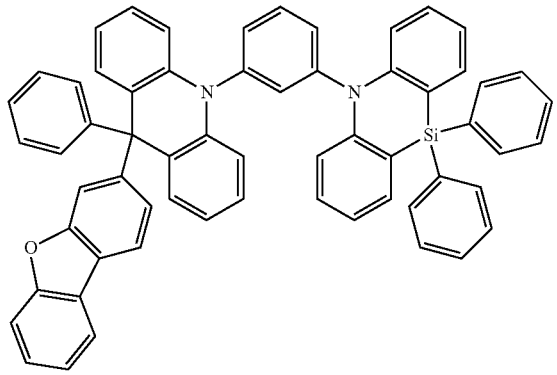

41

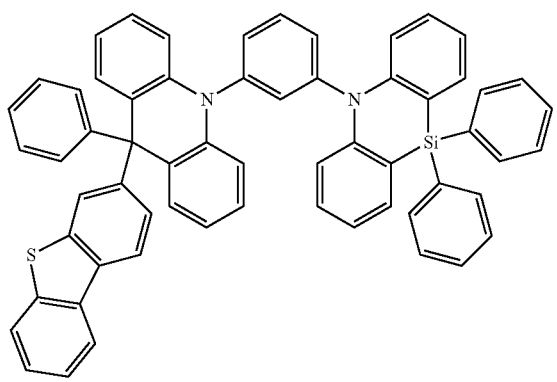

42

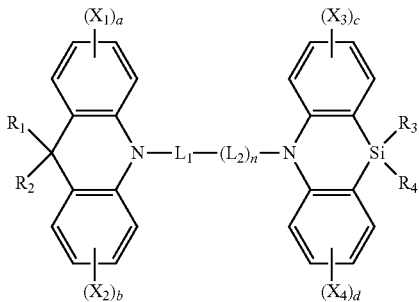

[Formula 1]

wherein in Formula 1, $L_1$ and $L_2$ are each independently a substituted or unsubstituted arylene group having 6 to 30 ring carbon atoms or a substituted or unsubstituted heteroarylene group having 2 to 30 ring carbon atoms, n is 0 or 1, $R_1$ to $R_4$ and $X_1$ to $X_4$ are each independently a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. $R_1$ to $R_4$ and $X_1$ to $X_4$ being separate or forming a ring by combining adjacent groups with each other, and a to d are each independently an integer of 0 to 4.

The hole transport region may include a multilayer structure, and a layer in the multilayer structure contacting the emission layer may include the heterocyclic compound represented by Formula 1.

The hole transport region may include a hole injection layer on the first electrode; a hole transport layer on the hole injection layer; and an electron blocking layer on the hole transport layer, and the electron blocking layer may include the heterocyclic compound represented by Formula 1.

$R_1$ to $R_4$ may each independently be a substituted or unsubstituted aryl group having 6 to 30 ring carbon atoms or a substituted or unsubstituted heteroaryl group having 2 to 30 ring carbon atoms.

At least two of $R_1$ to $R_4$ may be a substituted or unsubstituted aryl group having 6 to 30 ring carbon atoms.

The compound represented by Formula 1 may be represented by the following Formula 1-1:

43

The embodiments may be realized by providing an organic electroluminescence device including a first electrode; a hole transport region on the first electrode; an emission layer on the hole transport region; an electron transport region on the emission layer; and a second electrode on the electron transport region, wherein the hole transport region includes a heterocyclic compound represented by the following Formula 1:

[Formula 1-1]

wherein in Formula 1-1, $R_5$ to $R_8$ are each independently a hydrogen atom, a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms, e to h are each independently an integer of 0 to 4, and $L_1$, $L_2$, $X_1$ to $X_4$, "a" to "d," and n are defined the same as those of Formula 1.

$L_1$ may be a substituted or unsubstituted phenylene group, a substituted or unsubstituted divalent biphenyl group, a substituted or unsubstituted divalent terphenyl group, a substituted or unsubstituted fluorenylene group, or a heteroarylene group having at least one nitrogen atom (N) as a heteroatom.

n may be 1, $L_1$ may be a substituted or unsubstituted arylene group having 6 to 30 ring carbon atoms, and $L_2$ may be a substituted or unsubstituted heteroarylene group having 2 to 30 ring carbon atoms.

$L_1$ may be a group represented by one of the following Formulae $L_{1-1}$ to $L_{1-11}$:

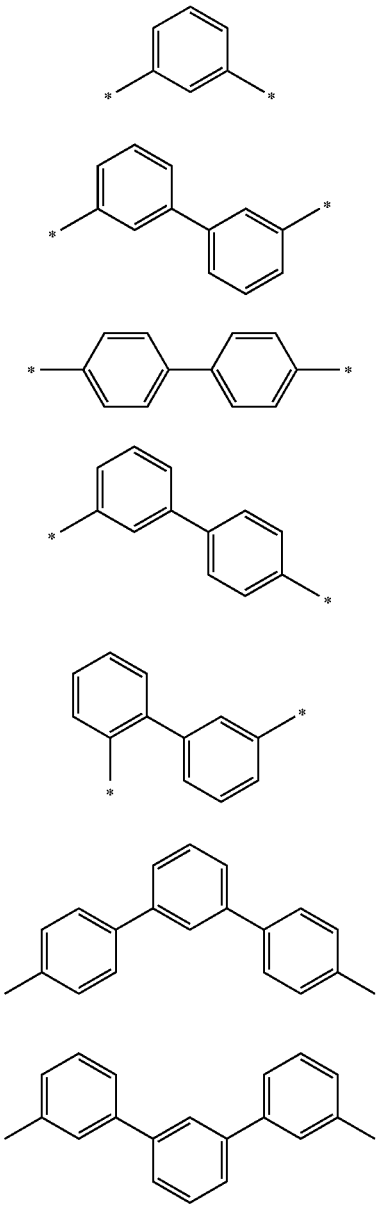

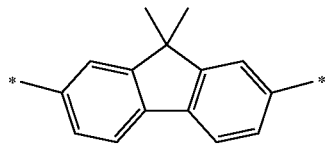

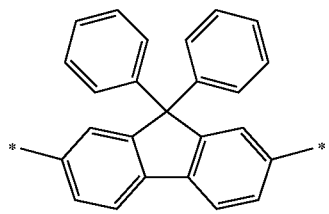

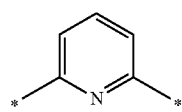

wherein Formulae $L_{1-1}$ to $L_{1-11}$ are each independently unsubstituted or substituted with a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30.

The heterocyclic compound represented by Formula 1 may be a compound of the following Compound Group 1:

[Compound Group 1]

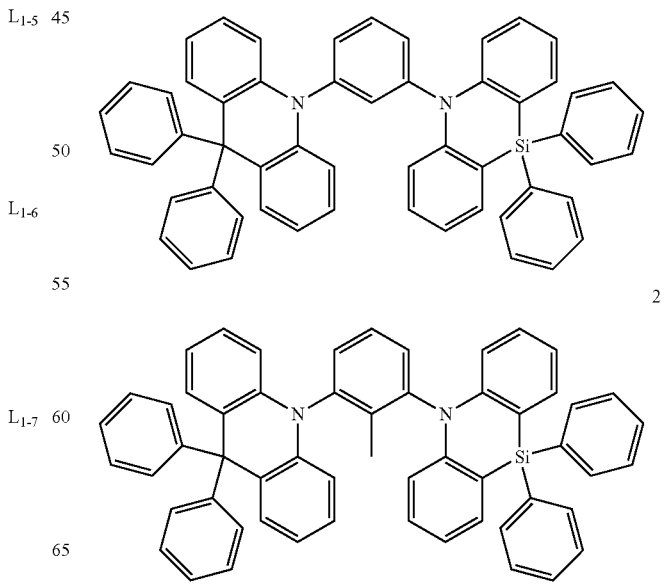

3
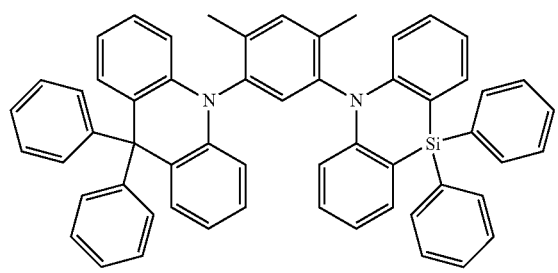
4
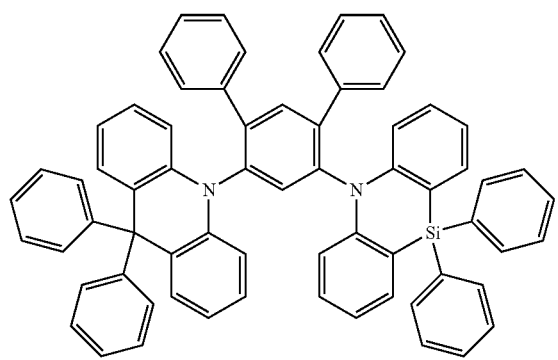
5
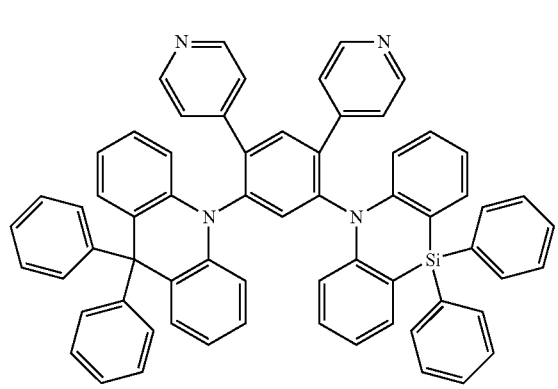
6
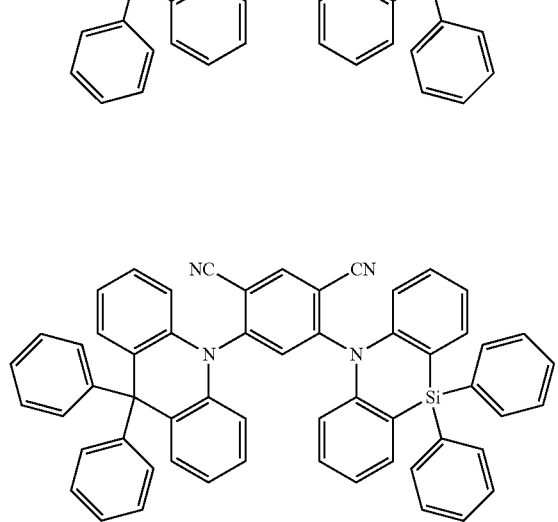
7
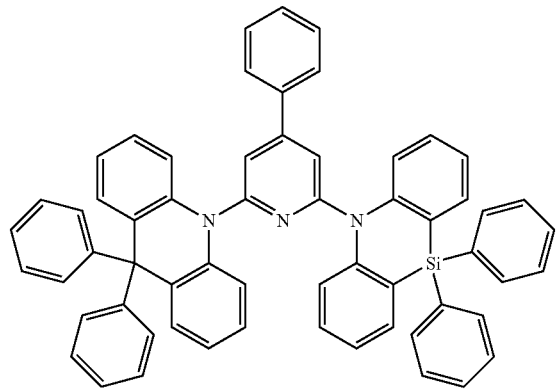
8
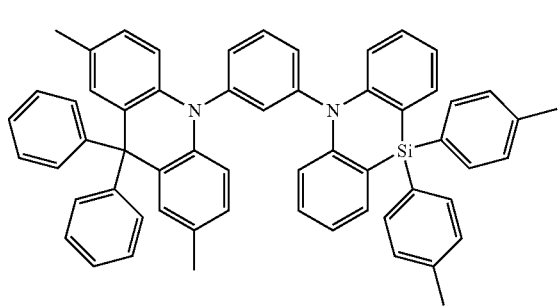
9
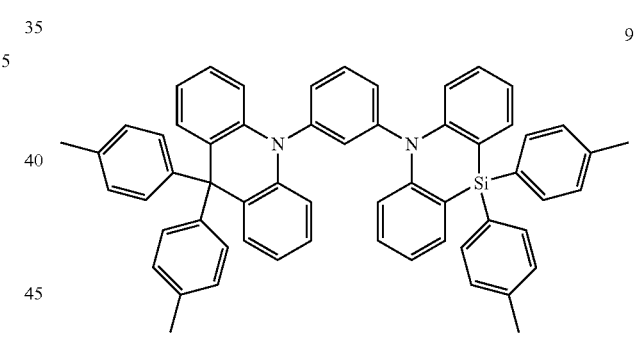
10
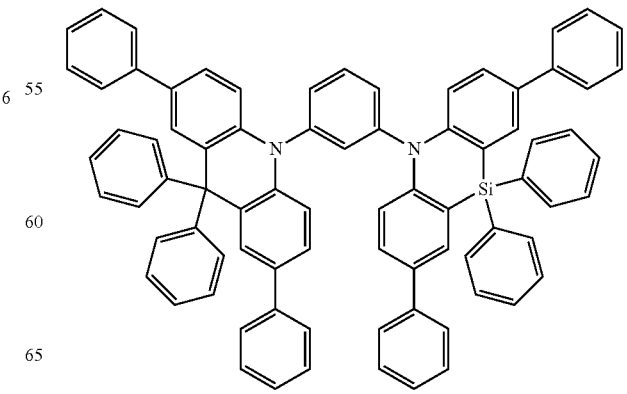

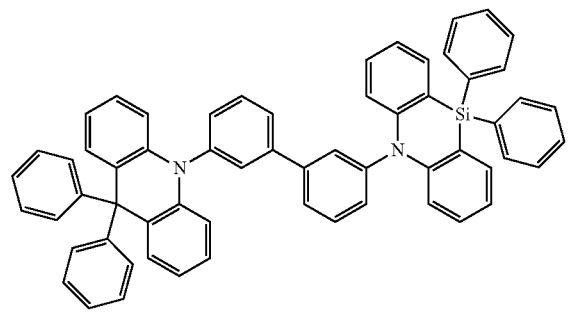
11
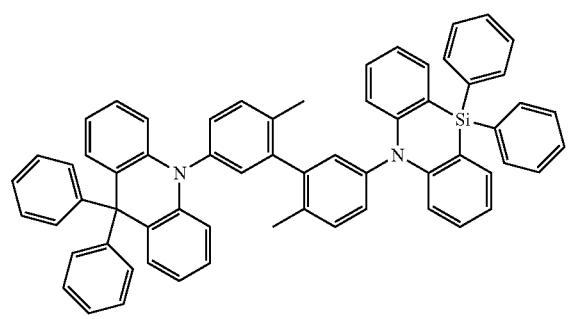
12
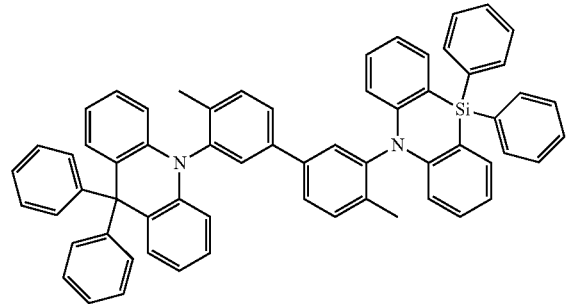
13
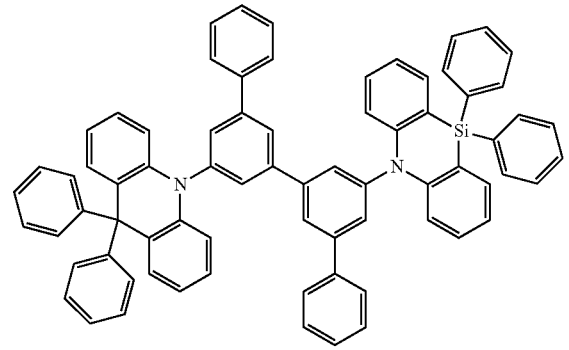
14
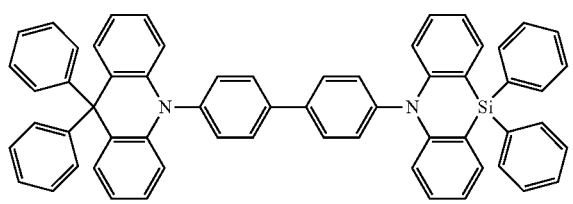
15
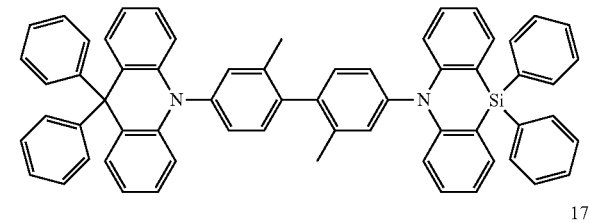
16
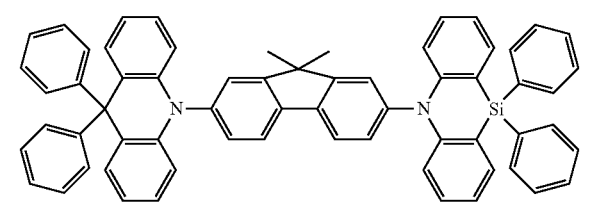
17
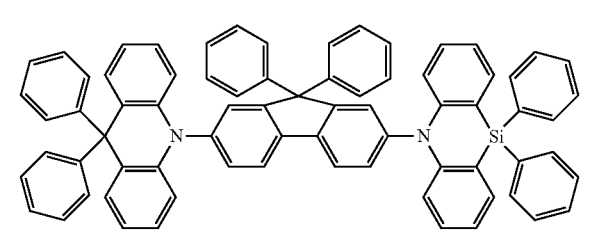
18
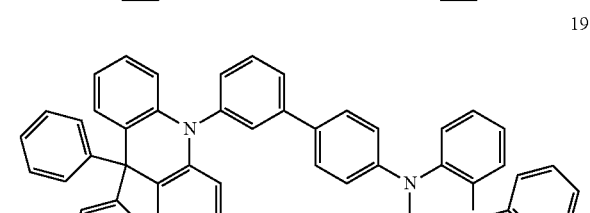
19
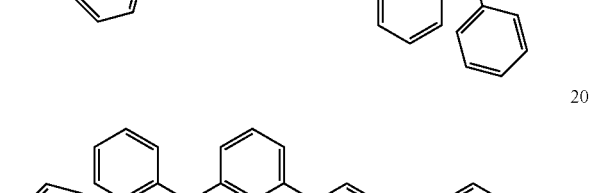
20
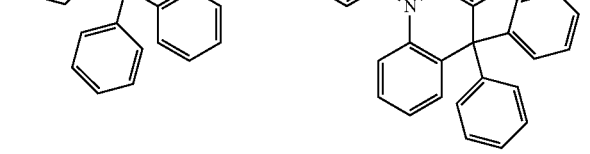
21
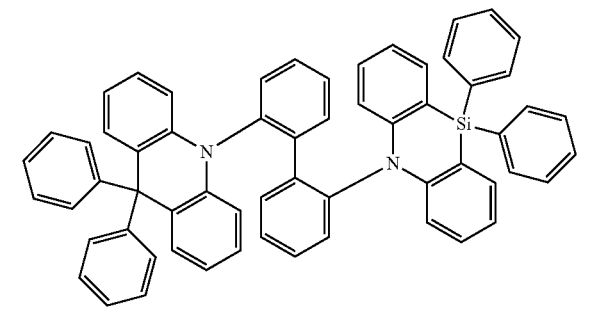

22
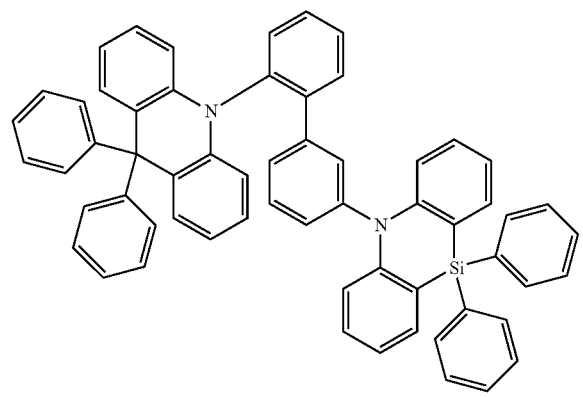
23
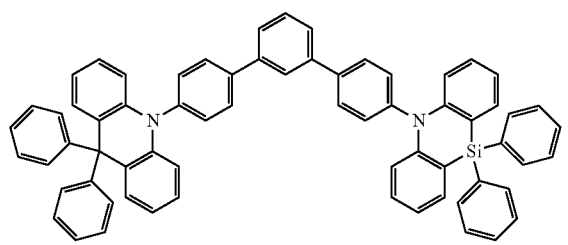
24
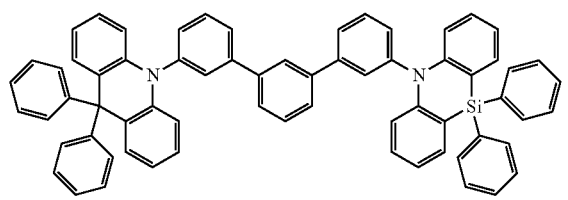
25
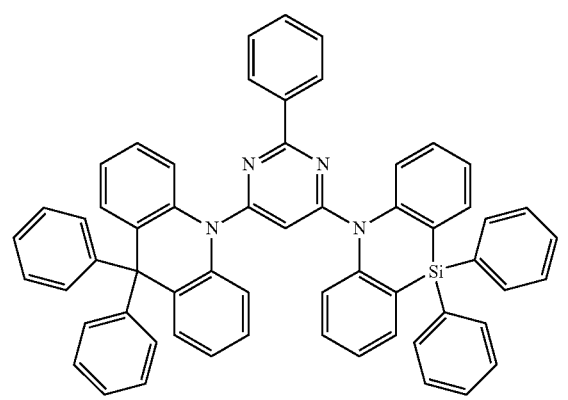
26
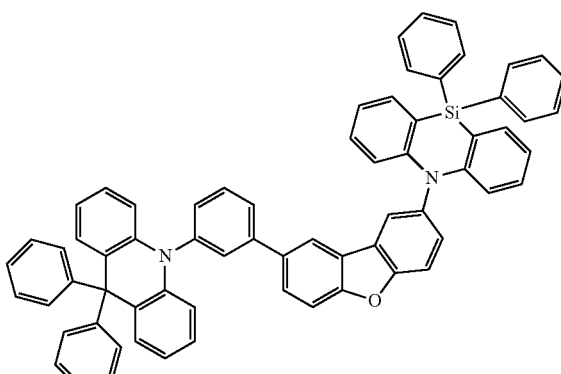
27
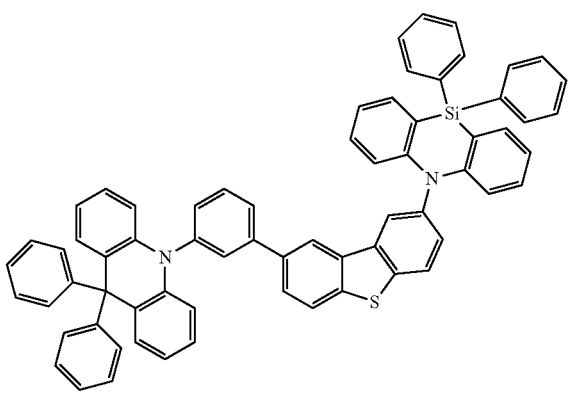
28
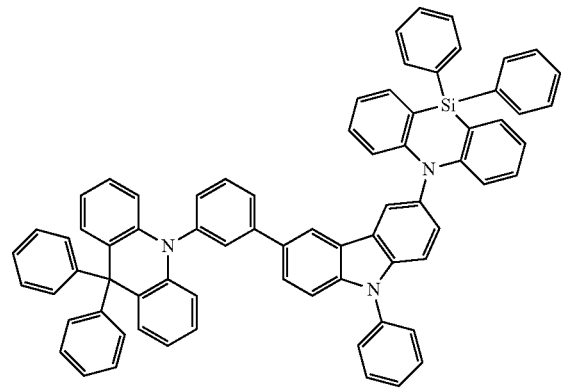
29
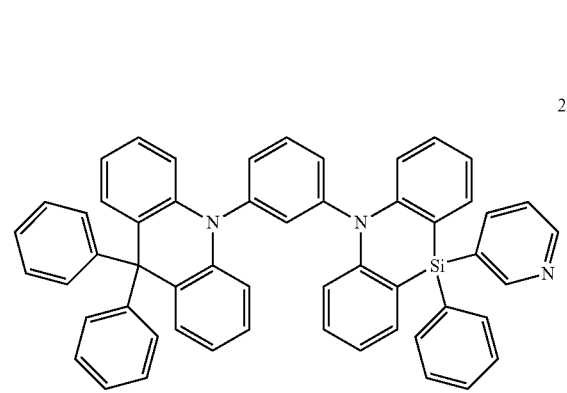

30
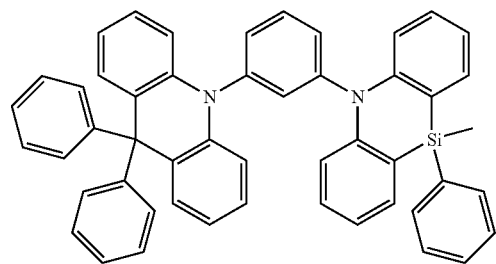
31
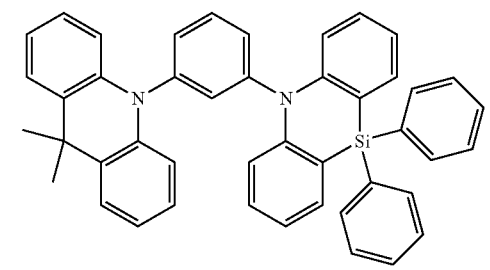
32
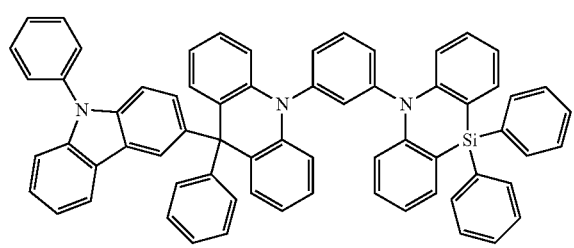
33
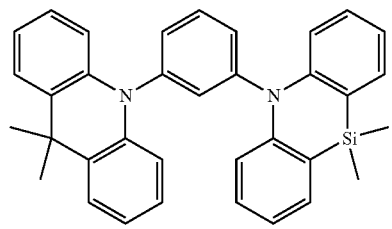
34
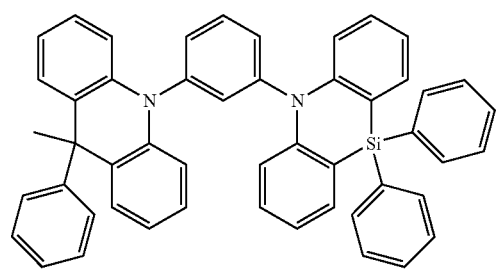
35
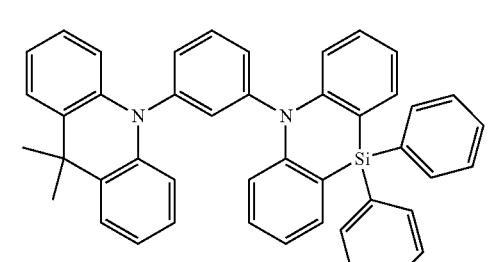
36
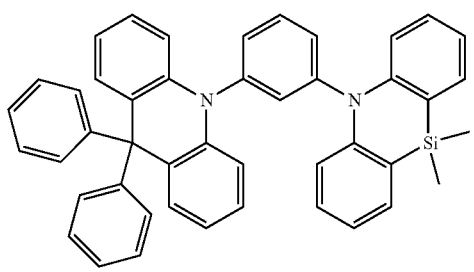
37
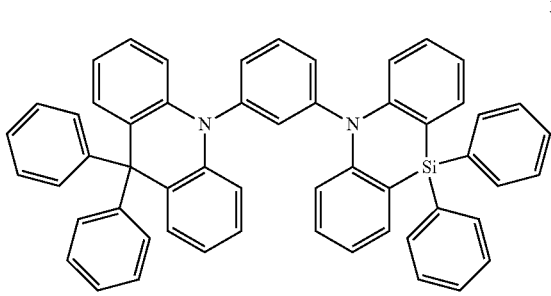
38
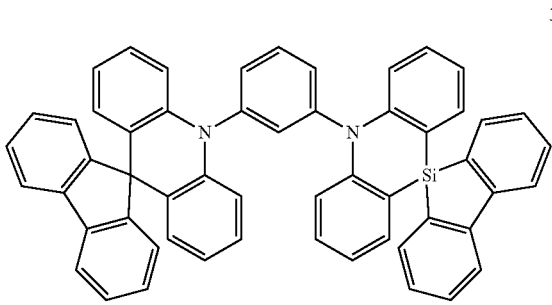
39
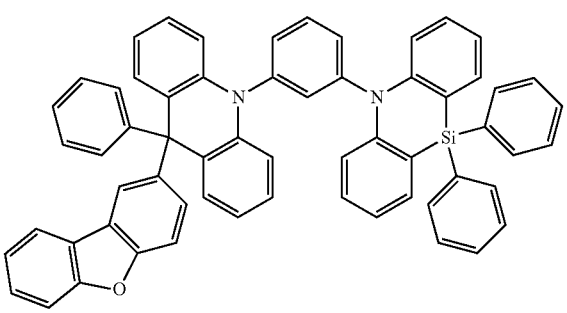
40
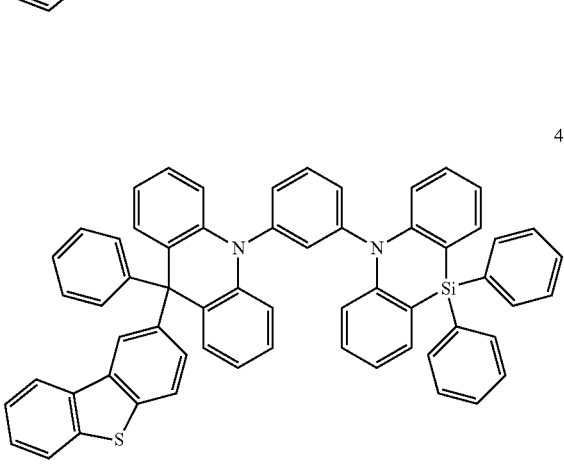

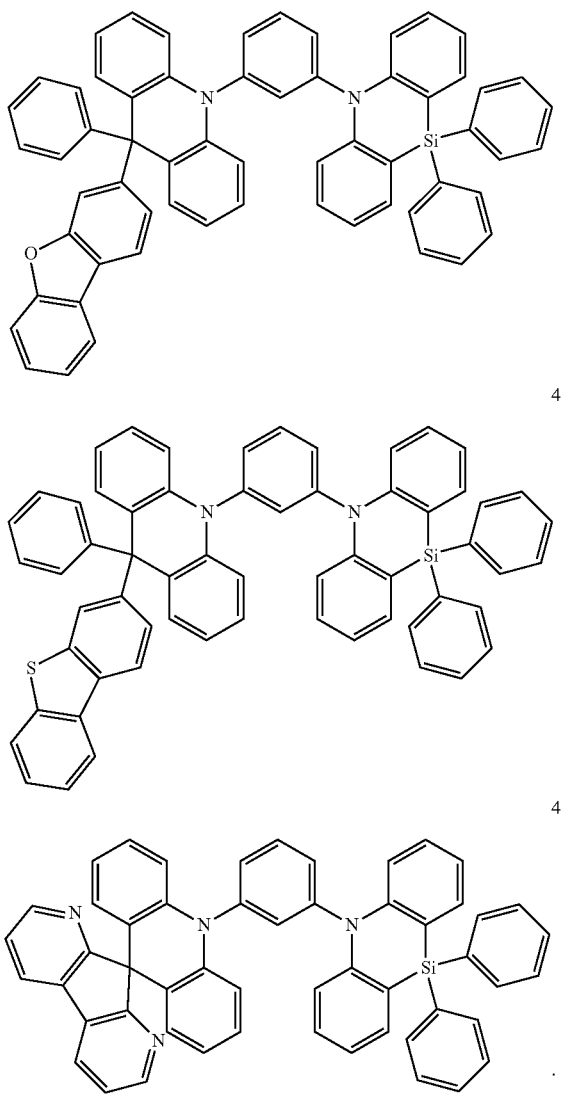

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
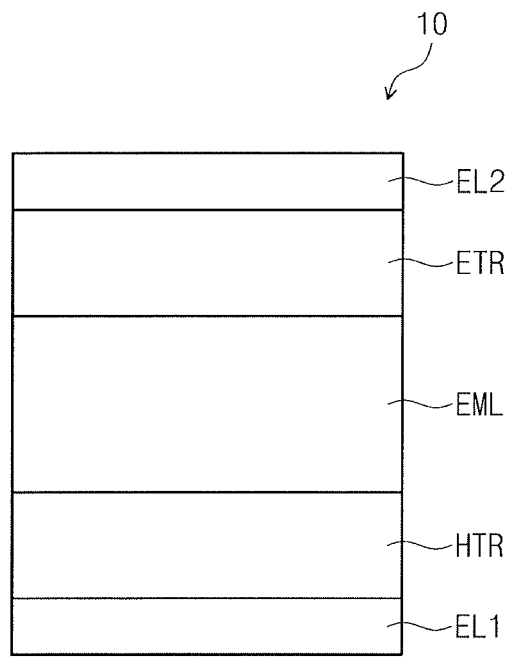
FIG. 1 illustrates a schematic cross-sectional view of an organic electroluminescence device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements for explaining each drawing. In the drawings, the sizes of elements may be enlarged for clarity of the present disclosure. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "includes," "including," "comprises," or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be directly on the other part, or intervening layers may also be present. On the contrary, when a layer, a film, a region, a plate, etc. is referred to as being "under" another part, it can be directly under the other part, or intervening layers may also be present. As used herein, the term "or" is not an exclusive term, e.g., "A or B" would include A, B, or A and B.

In the present disclosure, —. means a part to be connected, e.g., a bonding site.

In the present disclosure, "substituted or unsubstituted" may mean unsubstituted or substituted with at least one substituent selected from the group consisting of deuterium, halogen, cyano, nitro, amino, silyl, boron, phosphine oxide, phosphine sulfide, alkyl, alkenyl, aryl and heterocycle group. In addition, each of the substituent illustrated above may be substituted or unsubstituted. For example, biphenyl may be interpreted as aryl, or phenyl substituted with phenyl.

In the present disclosure, the description of forming a ring by combining adjacent groups with each other may mean forming a substituted or unsubstituted hydrocarbon ring or a substituted or unsubstituted heterocycle by combining adjacent groups with each other. A hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or polycycle. In addition, the ring formed by combining adjacent groups with each other may be connected with another ring to form a spiro structure.

In the present disclosure, "an adjacent group" may mean a substituent at an atom which is directly connected with another atom at which a corresponding substituent is substituted, another substituent at an atom at which a corresponding substituent is substituted, or a substituent stereoscopically disposed at the nearest position to a corresponding substituent. For example, two methyl groups in 1,2-dimethylbenzene may be interpreted as "adjacent groups", and two ethyl groups in 1,1-diethylcyclopentene may be interpreted as "adjacent groups".

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, biphenylene, triphenylene, pyrenyl, benzofluoranthenyl, chrysenyl, etc., without limitation.

In the present disclosure, the fluorenyl group may be substituted, and two substituents may be combined with each other to form a spiro structure. Examples of the substituted fluorenyl group may include the following groups, without limitation:

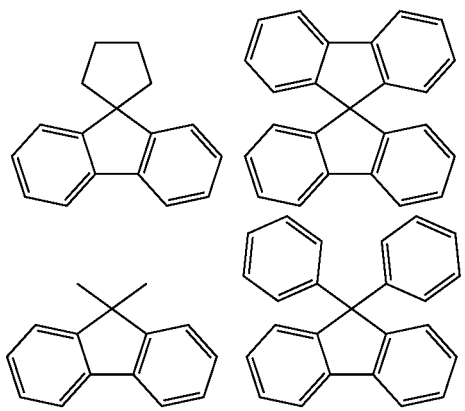

In the present disclosure, the heteroaryl group may be heteroaryl including at least one of O, N, P, Si, or S as a heteroatom. When the heteroaryl group includes two heteroatoms, the two heteroatoms may be the same or different from each other. The carbon number of the heteroaryl group for forming a ring may be 2 to 30, or 2 to 20. The heteroaryl group may be monocyclic heteroaryl or polycyclic heteroaryl. Polycyclic heteroaryl may have bicyclic or tricyclic structure, for example. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroaryl carbazole, N-alkyl carbazole, benzoxazole, benzoimidazole, benzothiazole, benzocarbazole, benzothiophene, dibenzothiophenyl, thienothiophene, benzofuranyl, phenanthroline, thiazolyl, isoxazolyl, oxadiazolyl, thiadiazolyl, benzothiazolyl, phenothiazinyl, dibenzosilole, dibenzofuranyl, etc., without limitation.

In the present disclosure, the above explanation on the aryl group may be applied to the arylene group, except that the arylene is divalent.

The above explanation on the heteroaryl group may be applied to the heteroarylene group, except that the heteroarylene is divalent.

In the present disclosure, the silyl group may include alkyl silyl and aryl silyl. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the boron group may include alkyl boron and aryl boron. Examples of the boron group may include trimethyl boron, triethyl boron, t-butyl dimethyl boron, triphenyl boron, diphenyl boron, phenyl boron, etc., without limitation.

In the present disclosure, the alkenyl group may be linear or branched. The carbon number is not specifically limited, and may be 2 to 30, 2 to 20, or 2 to 10. Examples of the alkenyl group may include vinyl, 1-butenyl, 1-pentenyl, 1,3-butadienyl aryl, styrenyl, styrylvinyl, etc., without limitation.

In the present disclosure, the carbon number of the amino group is not specifically limited, and may be 1 to 30. The amino group may include alkyl amino and aryl amino. Examples of the amino group may include methylamino, dimethylamino, phenylamino, diphenylamino, naphthylamino, 9-methyl-anthracenylamino, triphenylamino, etc., without limitation.

Hereinafter, the heterocyclic compound according to an embodiment of the present disclosure will be explained.

The heterocyclic compound according to an embodiment of the present disclosure may be represented by the following Formula 1:

[Formula 1]

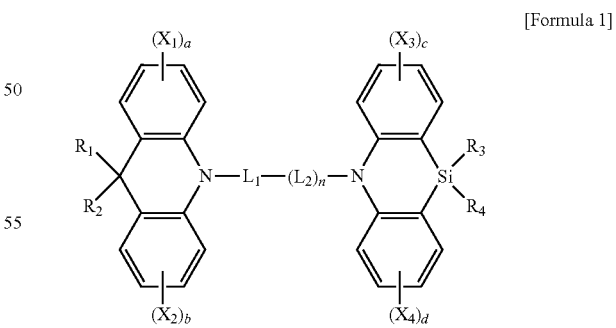

In Formula 1, $L_1$ and $L_2$ may each independently be or include, e.g., a substituted or unsubstituted arylene group having 6 to 30 ring carbon atoms or a substituted or unsubstituted heteroarylene group having 2 to 30 ring carbon atoms, n may be, e.g., 0 or 1. $R_1$ to $R_4$ and $X_1$ to $X_4$ may each independently be or include, e.g., a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms. In an implementation, $R_1$ to $R_4$ and $X_1$ to $X_4$ may be separate or may form a ring by combining adjacent groups with each other. a to d may each independently be, e.g., an integer of 0 to 4.

In case "a" is an integer of 2 or more, a plurality of $X_1$ may be the same or different from each other. In case "a" is an integer of 2 or more, adjacent $X_1$'s may combine with each other to form a ring. In an implementation, adjacent $X_1$'s may combine with each other to form a monocyclic ring. In an implementation, a case where adjacent $X_1$'s combine with each other to form a benzene ring, may be excluded.

In case "b" is an integer of 2 or more, a plurality of $X_2$ may be the same or different from each other. In case "b" is an integer of 2 or more, adjacent $X_2$'s may combine with each other to form a ring. In an implementation, adjacent $X_2$'s may combine with each other to form a monocyclic ring. In an implementation, a case where adjacent $X_2$'s combine with each other to form a benzene ring, may be excluded.

In case "c" is an integer of 2 or more, a plurality of $X_3$ may be the same or different from each other. In case "c" is an integer of 2 or more, adjacent $X_3$'s may combine with each other to form a ring. In an implementation, adjacent $X_3$'s may combine with each other to form a monocyclic ring. In an implementation, a case where adjacent $X_3$'s combine with each other to form a benzene ring, may be excluded.

In case "d" is an integer of 2 or more, a plurality of $X_4$ may be the same or different from each other. In case "d" is an integer of 2 or more, adjacent $X_4$'s may combine with each other to form a ring. In an implementation, adjacent $X_4$'s may combine with each other to form a monocyclic ring. In an implementation, a case where adjacent $X_4$'s combine with each other to form a benzene ring, may be excluded.

In an implementation, in Formula 1, each of "a" to "d" may be 0. In an implementation, a relation $a+b+c+d \geq 1$ may be satisfied. In an implementation, in Formula 1, each of "a" to "d" may be 1, and each of $X_1$ to $X_4$ may be independently a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

In an implementation, in Formula 1, each of "a" to "d" may be 1, and each of $X_1$ to $X_4$ may be independently methyl, ethyl, or a substituted or unsubstituted phenyl group. In an implementation, in Formula 1, each of "a" to "d" may be 1, and each of $X_1$ to $X_4$ may be a substituted or unsubstituted phenyl group.

In an implementation, in Formula 1, $R_1$ to $R_4$ may each independently be or include, e.g., a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. In an implementation, in Formula 1, $R_1$ to $R_4$ may each independently be or include, e.g., a substituted or unsubstituted alkyl group having 1 to 10 carbon atoms, a substituted or unsubstituted aryl group having 6 to 15 ring carbon atoms, or a substituted or unsubstituted heteroaryl group having 2 to 15 ring carbon atoms.

In an implementation, in Formula 1, $R_1$ to $R_4$ may each independently be or include. e.g., a substituted or unsubstituted methyl, a substituted or unsubstituted monocyclic aryl group, or a substituted or unsubstituted monocyclic heteroaryl group.

In an implementation, in Formula 1, $R_1$ and $R_2$ may be the same or different from each other. In an implementation, in Formula 1, $R_1$ and $R_2$ may combine with each other to form a ring. In an implementation, in Formula 1, $R_1$ and $R_2$ may each independently be or include, e.g., a substituted or unsubstituted aryl group having 6 to 30 carbon atoms for forming a ring. In an implementation, in Formula 1. $R_1$ and $R_2$ may each independently be or include, e.g., a substituted or unsubstituted alkyl group having 1 to 10 carbon atoms. In an implementation, in Formula 1, $R_1$ may be or may include, e.g., a substituted or unsubstituted aryl group having 6 to 30 ring carbon atoms, and $R_2$ may be or may include, e.g., a substituted or unsubstituted alkyl group having 1 to 10 carbon atoms. In an implementation, in Formula 1, $R_1$ may be or may include, e.g., a substituted or unsubstituted aryl group having 6 to 30 ring carbon atoms, and $R_2$ may be or may include, e.g., a substituted or unsubstituted heteroaryl group having 2 to 30 ring carbon atoms.

In an implementation, in Formula 1, $R_3$ and $R_4$ may be the same or different from each other. In an implementation, in Formula 1, $R_3$ and $R_4$ may combine with each other to form a ring. In an implementation, in Formula 1, $R_3$ and $R_4$ may each independently be or include, e.g., a substituted or unsubstituted aryl group having 6 to 30 carbon atoms for forming a ring. In an implementation, $R_3$ may be or may include, e.g., a substituted or unsubstituted alkyl group having 1 to 10 carbon ring carbon atoms, and $R_4$ may be or may include, e.g., a substituted or unsubstituted alkyl group having 1 to 10 carbon atoms. In an implementation, in Formula 1, $R_3$ may be or may include, e.g., a substituted or unsubstituted aryl group having 6 to 30 ring carbon atoms, and $R_4$ may be or may include, e.g., a substituted or unsubstituted heteroaryl group having 2 to 30 ring carbon atoms.

In an implementation, in Formula 1, $R_1$ to $R_4$ may each independently be or include, e.g., a substituted or unsubstituted phenyl group. In an implementation, the compound represented by Formula 1 may be a compound represented by the following Formula 1-1.

[Formula 1-1]

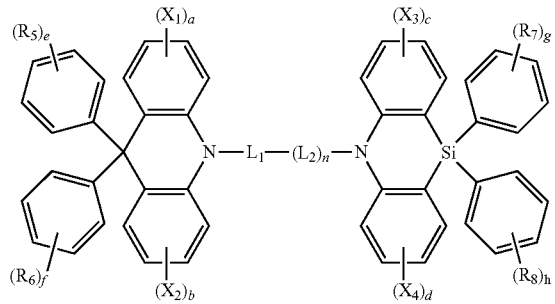

In Formula 1-1, $R_5$ to $R_8$ may each independently be or include, e.g., a hydrogen atom, a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms. e to h may each independently be, e.g., an integer of 0 to 4. $L_1$, $L_2$, $X_1$ to $X_4$, "a" to "d," and n may be the same as defined above.

In case "e" is an integer of 2 or more, a plurality of $R_5$ may be the same or different from each other. In case "f" is an integer of 2 or more, a plurality of $R_6$ may be the same or different from each other. In case "g" is an integer of 2 or more, a plurality of $R_7$ may be the same or different from each other. In case "h" is an integer of 2 or more, a plurality of $R_8$ may be the same or different from each other.

In an implementation, in Formula 1-1, each of "e" to "h" may be 0. In an implementation, a relation e+f+g+h≥1 may be satisfied.

In an implementation, in Formula 1-1, each of "e" to "h" may be 1, and $R_5$ to $R_8$ may each independently be or include, e.g., a substituted or unsubstituted alkyl group having 1 to 10 carbon atoms. In an implementation, each of $R_5$ to $R_8$ may be independently methyl or ethyl.

In an implementation, in Formula 1, $R_1$ and $R_2$ may combine with each other to form a ring. In an implementation, in Formula 1, $R_3$ and $R_4$ may combine with each other to form a ring.

In an implementation, in Formula 1, $L_1$ may be or may include, e.g., a substituted or unsubstituted phenylene group, a substituted or unsubstituted divalent biphenyl group, a substituted or unsubstituted divalent terphenyl group, a substituted or unsubstituted fluorenylene group, or a heteroarylene group having at least one nitrogen atom (N) as a heteroatom. In an implementation, n may be 0.

In an implementation, in Formula 1, $L_1$ may be or may include, e.g., a substituted or unsubstituted phenylene group. In an implementation, in Formula 1, $L_1$ may be or may include, e.g., a phenylene group which is unsubstituted or substituted with, e.g., a cyano group, alkyl group, aryl group, or heteroaryl group. In an implementation, in Formula 1, $L_1$ may be or may include, e.g., a phenylene group which is unsubstituted or substituted with, e.g., a cyano group, methyl, ethyl, phenyl, or a heteroaryl group having at least one nitrogen atom (N) as a heteroatom. In an implementation, in Formula 1, $L_1$ may be substituted, with 2 or more substituents. In an implementation, in Formula 1, $L_1$ may be an unsubstituted phenylene group.

In an implementation, in Formula 1, $L_1$ may be or may include, e.g., a substituted or unsubstituted divalent biphenyl group. In an implementation, in Formula 1, $L_1$ may be, e.g., a divalent biphenyl group which is unsubstituted or substituted with an alkyl group, aryl group, or heteroaryl group. In an implementation, in Formula 1, $L_1$ may be, e.g., a divalent biphenyl group which is unsubstituted or substituted with methyl, ethyl, or phenyl. In an implementation, in Formula 1, $L_1$ may be a divalent biphenyl group which is substituted with 2 or more substituents. In an implementation, in Formula 1, $L_1$ may be, e.g., an unsubstituted divalent biphenyl group.

In an implementation, in Formula 1, $L_1$ may be, e.g., a substituted or unsubstituted divalent terphenyl group.

In an implementation, in Formula 1, $L_1$ may be or may include, e.g., a substituted or unsubstituted fluorenylene group. In an implementation, in Formula 1, $L_1$ may be, e.g., a fluorenylene group which is unsubstituted or substituted with an alkyl group or aryl group. In an implementation, in Formula 1, $L_1$ may be, e.g., a fluorenylene group which is substituted with two methyl groups. In an implementation, in Formula 1, $L_1$ may be, e.g., a fluorenylene group which is substituted with two aryl groups. In an implementation, in Formula 1, $L_1$ may be, e.g., a fluorenylene group which is substituted with two phenyl groups.

In an implementation, in Formula 1. $L_1$ may be or may include, e.g., a substituted or unsubstituted heteroarylene group having 2 to 15 ring carbon atoms. In an implementation, in Formula 1. $L_1$ may be or may include. e.g., a substituted or unsubstituted monocyclic heteroarylene group. In an implementation, in Formula 1, $L_1$ may be, e.g., a heteroarylene group having at least one nitrogen atom (N) as a heteroatom. In an implementation, in Formula 1, $L_1$ may be or may include, e.g., a substituted or unsubstituted divalent pyridine group, a substituted or unsubstituted divalent pyrimidine group, or a substituted or unsubstituted divalent triazine group. In an implementation, in Formula 1, $L_1$ may be or may include, e.g., a substituted or unsubstituted divalent pyridine group or a substituted or unsubstituted divalent pyrimidine group. In an implementation, in Formula 1, $L_1$ may be, e.g., a divalent pyridine group which is unsubstituted or substituted with an aryl group, or a divalent pyrimidine group which is unsubstituted or substituted with an aryl group.

In an implementation, in Formula 1, n may be, e.g., 1, $L_1$ may be or may include, e.g., a substituted or unsubstituted arylene group having 6 to 30 carbon atoms for forming a ring, and $L_2$ may be or may include, e.g., a substituted or unsubstituted heteroarylene group having 2 to 30 carbon atoms for forming a ring.

In an implementation, in Formula 1, n may be, e.g., 1, $L_1$ may be or may include, e.g., a substituted or unsubstituted monocyclic arylene group, and $L_2$ may be or may include, e.g., a substituted or unsubstituted heteroarylene group having at least one of N, S or O as a heteroatom.

In an implementation, in Formula 1, n may be, e.g., 1, $L_1$ may be or may include, e.g., a substituted or unsubstituted phenylene group, and $L_2$ may be or may include, e.g., a substituted or unsubstituted carbazole group, a substituted or unsubstituted dibenzofuran group, or a substituted or unsubstituted dibenzothiophene group.

In an implementation, in Formula 1, $L_1$ may be, e.g., a group represented by one of the following Formulae $L_{1-1}$ to $L_{1-11}$.

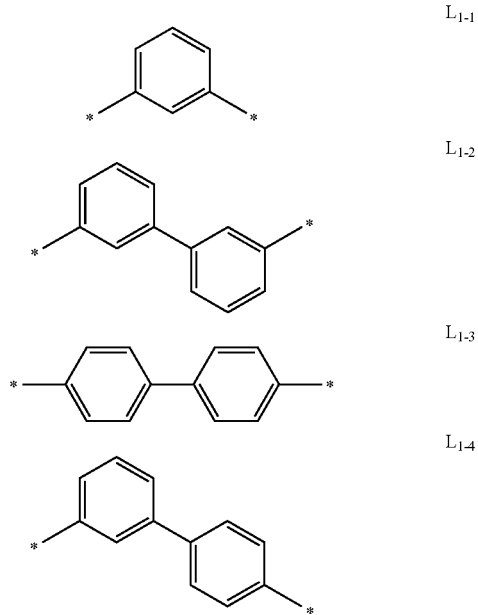

$L_{1-1}$ $L_{1-2}$ $L_{1-3}$ $L_{1-4}$

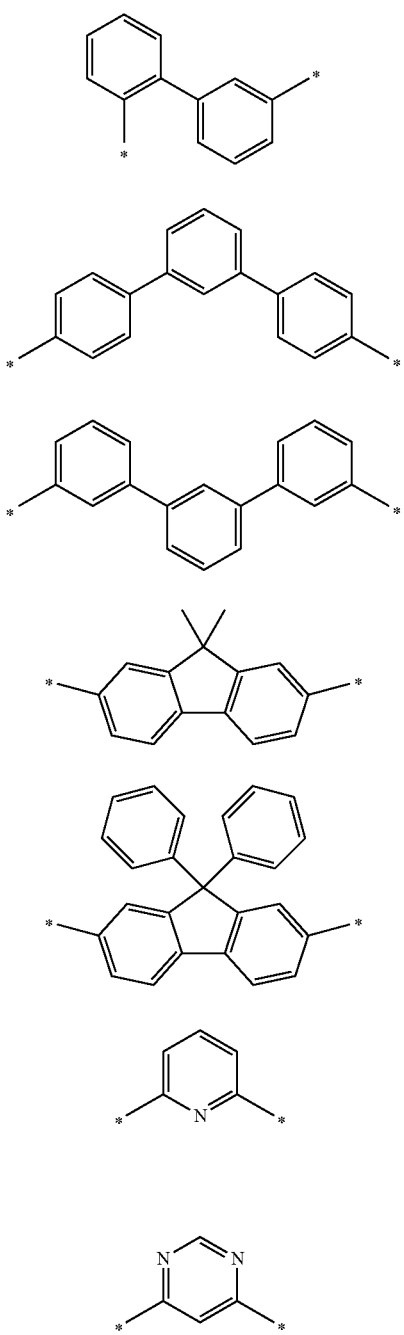

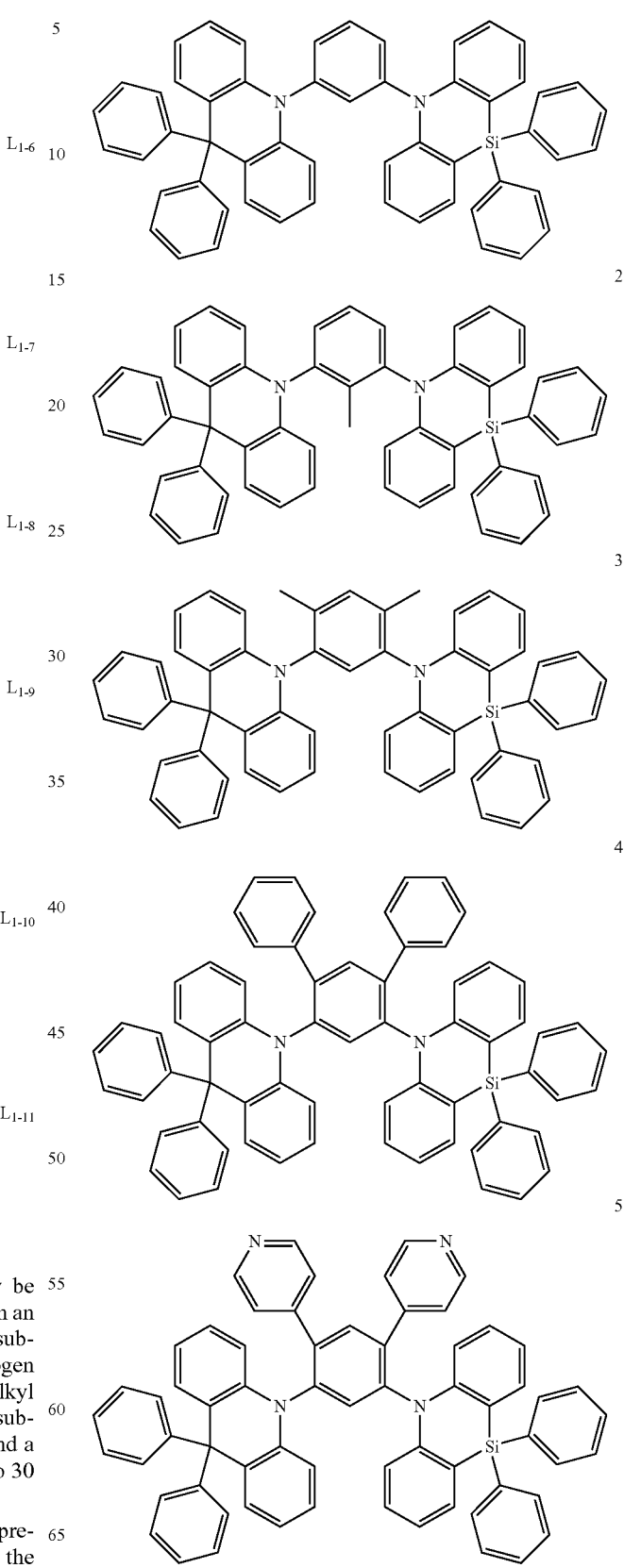

[Compound Group 1]

In an implementation, Formulae $L_{1-1}$ to $L_{1-11}$ may be independently substituted with at least one substituent. In an implementation, $L_{1-1}$ to $L_{1-11}$ may be independently unsubstituted or substituted with a deuterium atom, a halogen atom, a cyano group, a substituted or unsubstituted alkyl group having 1 to 10 carbon atoms, a substituted or unsubstituted aryl group having 6 to 15 ring carbon atoms, and a substituted or unsubstituted heteroaryl group having 2 to 30 ring carbon atoms.

In an implementation, the heterocyclic compound represented by Formula 1 may be, e.g., a compound of the following Compound Group 1.

6
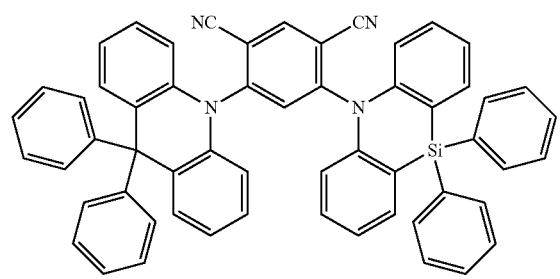
7
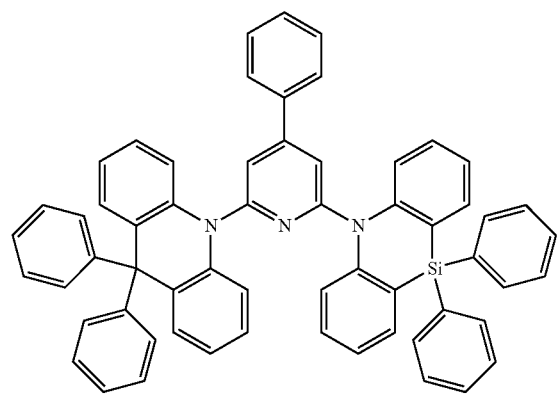
8
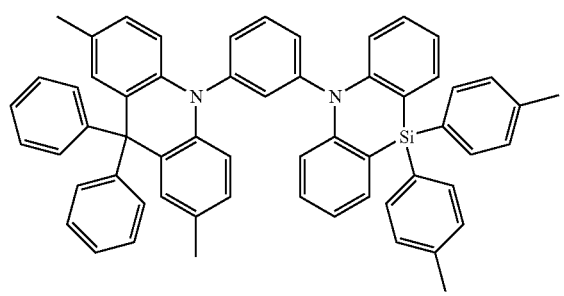
9
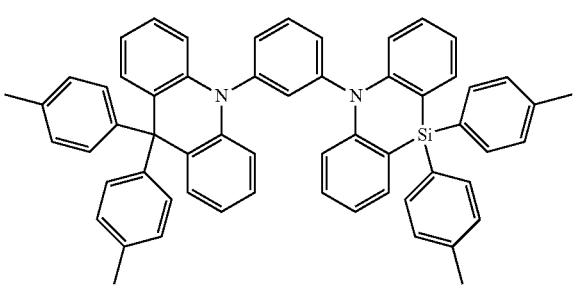
10
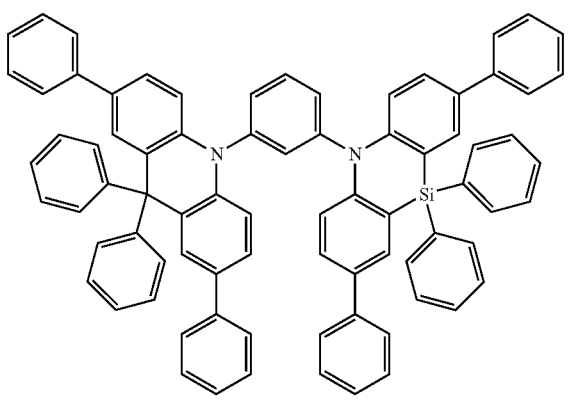
11
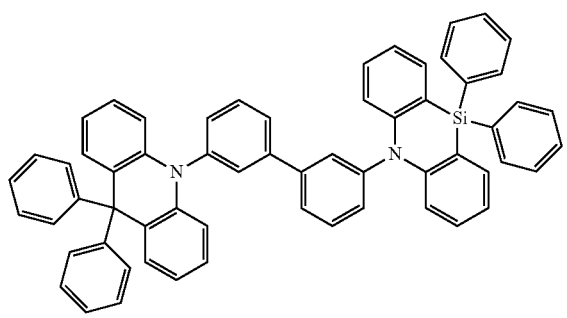
12
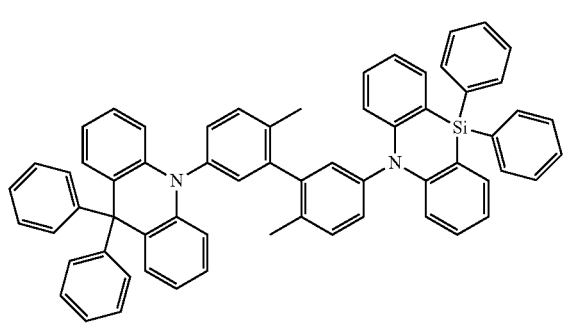
13
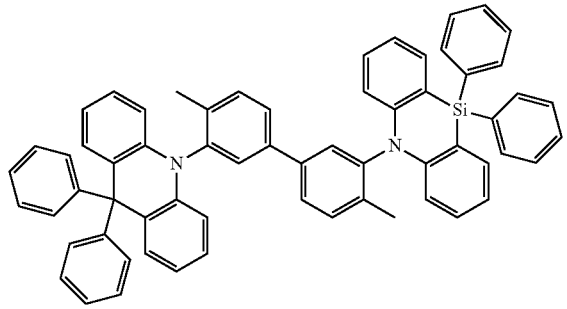

14
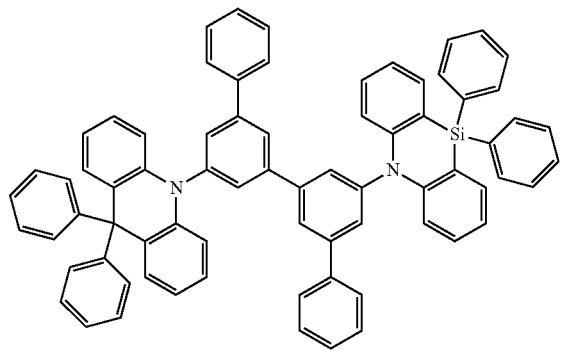
15
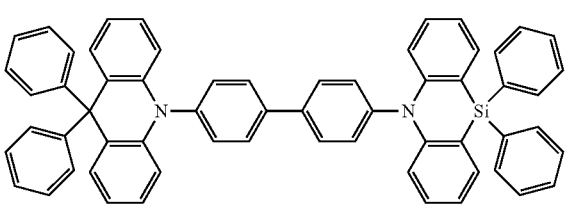
16
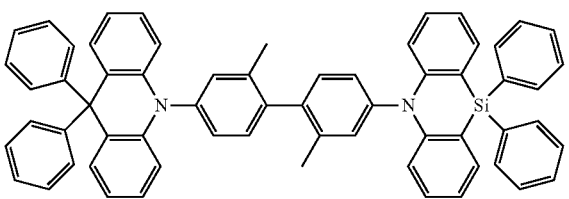
17
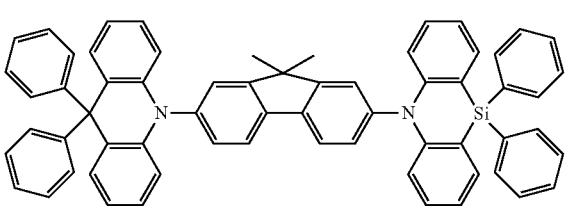
18
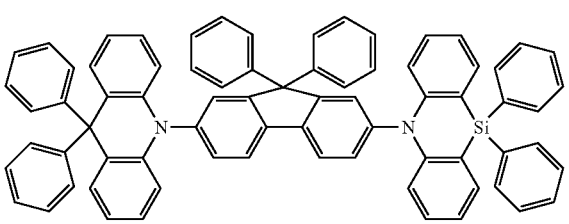
19
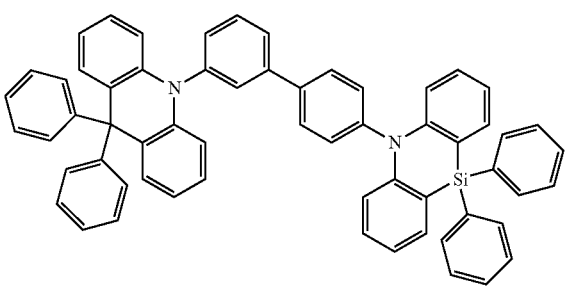
20
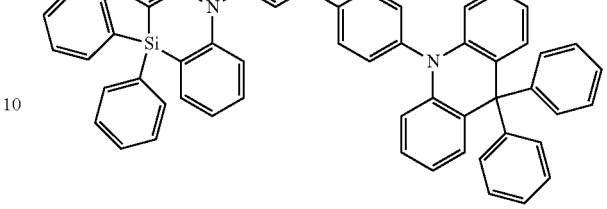
21
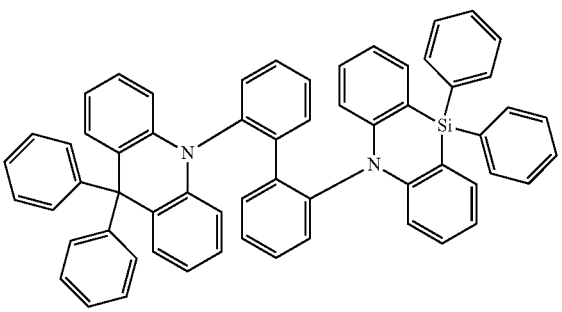
22
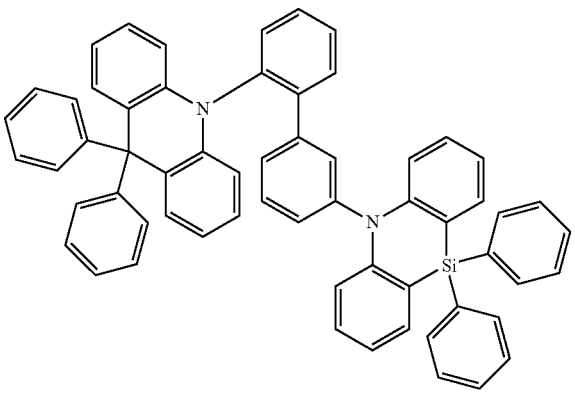
23
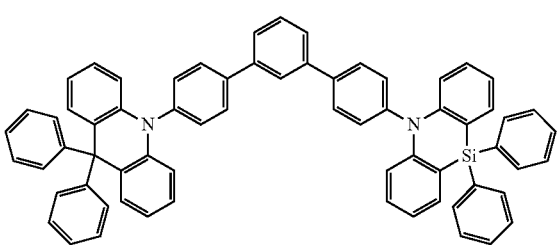
24
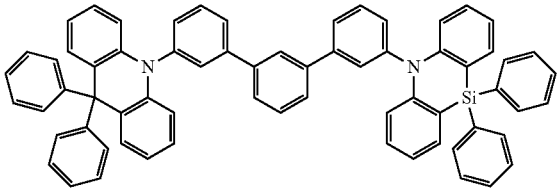

25
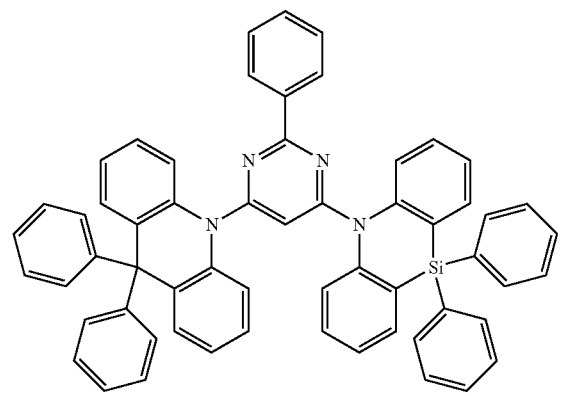
26
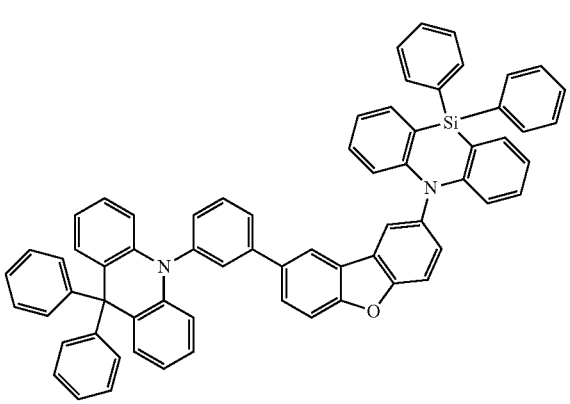
27
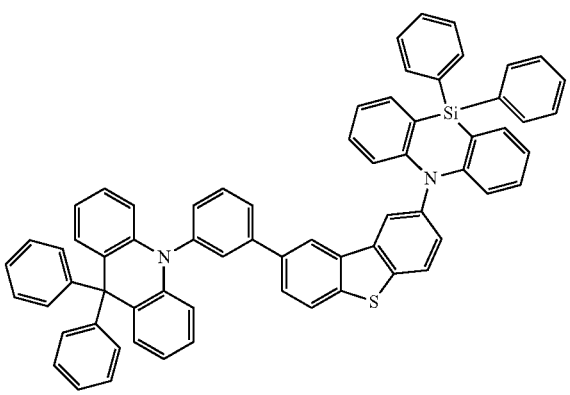
28
29
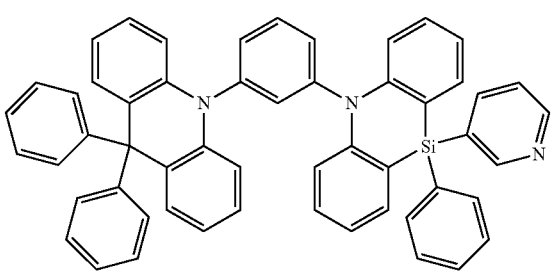
30
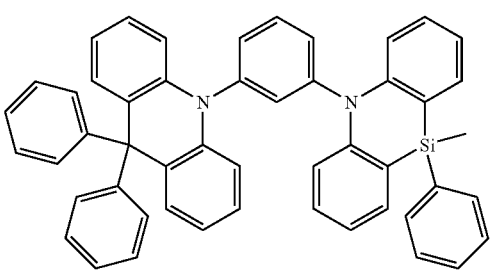
31
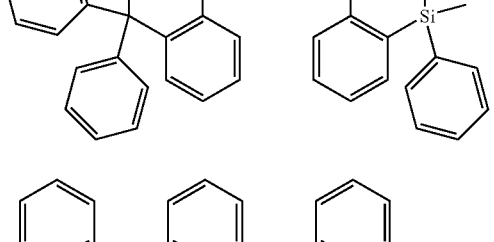
32
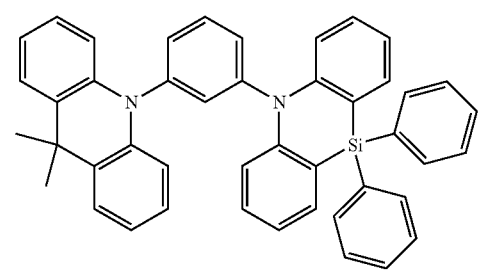
33
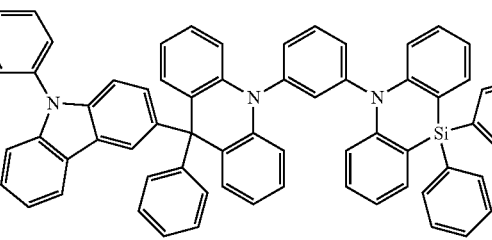
34
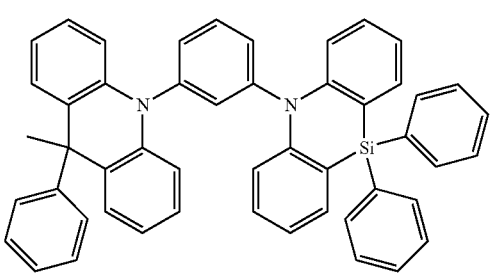

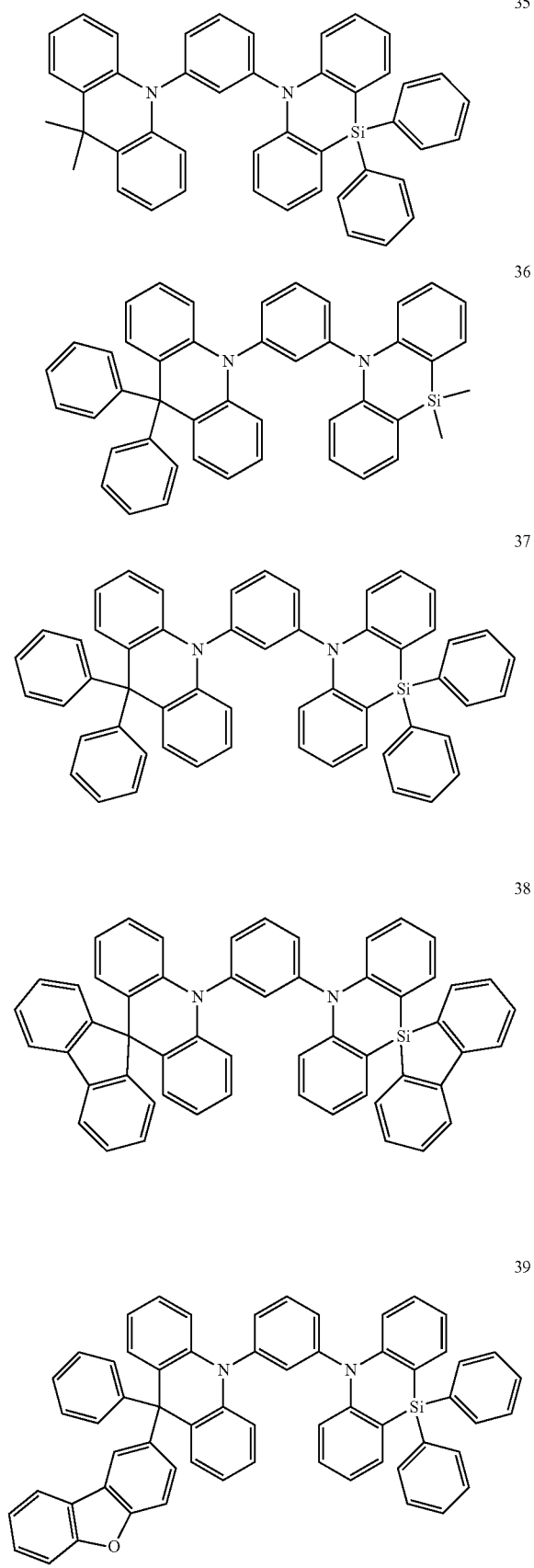
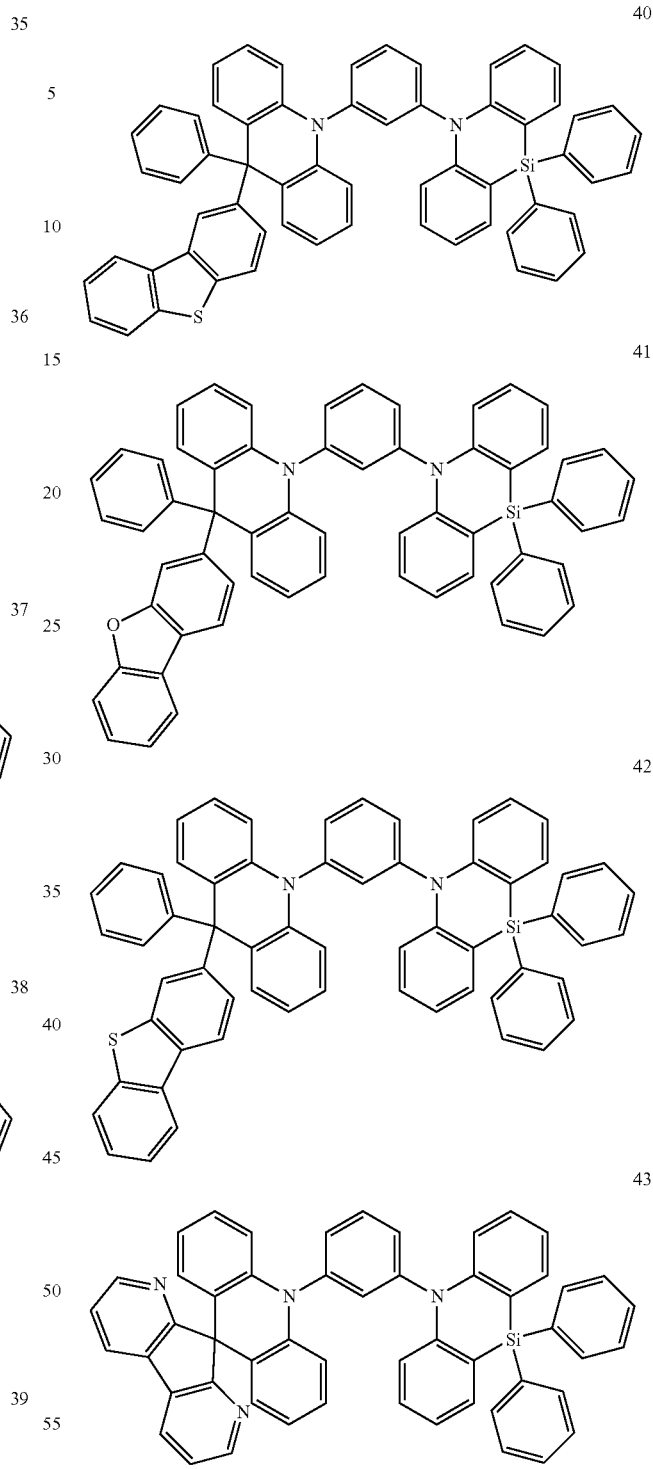

When the heterocyclic compound according to an embodiment of the present disclosure is applied to an organic electroluminescence device, device efficiency may be enhanced.

Hereinafter, an organic electroluminescence device according to an embodiment will be explained. The explanation will be mainly given with features different from the heterocyclic compound according to an embodiment of the present disclosure, and unexplained parts will follow the above-description on the heterocyclic compound according to an embodiment of the present disclosure.

An organic electroluminescence device according to an embodiment of the present disclosure may include the above-mentioned heterocyclic compound.

Figure 2:
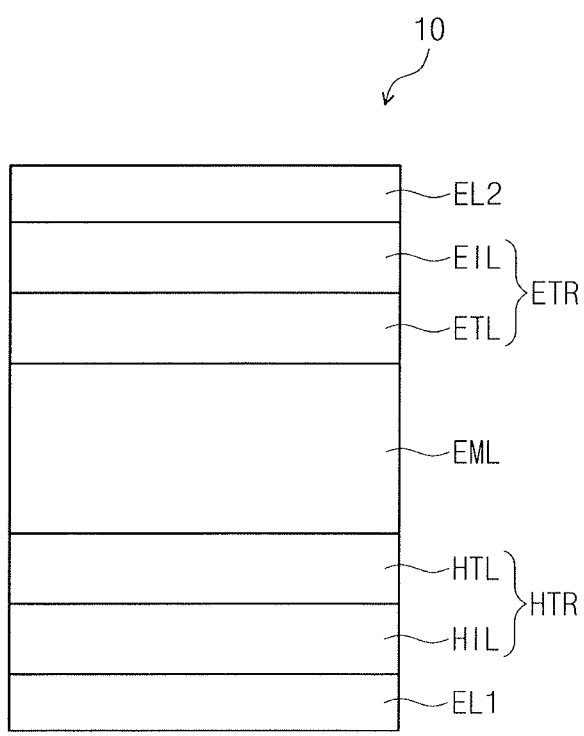
FIG. 2 illustrates a schematic cross-sectional view of an organic electroluminescence device according to an embodiment of the present disclosure.
Figure 3:
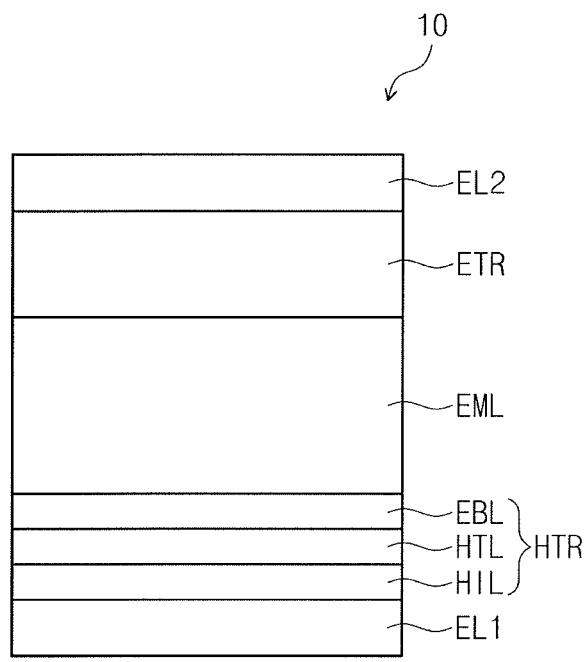
FIG. 3 illustrates a schematic cross-sectional view of an organic electroluminescence device according to an embodiment of the present disclosure.

FIG. 1 illustrates a schematic cross-sectional view of an organic electroluminescence device according to an embodiment of the present disclosure. FIG. 2 illustrates a schematic cross-sectional view of an organic electroluminescence device according to an embodiment of the present disclosure. FIG. 3 illustrates a schematic cross-sectional view of an organic electroluminescence device according to an embodiment of the present disclosure.

Referring to FIGS. 1 to 3, an organic electroluminescence device 10 according to an embodiment of the present disclosure may include a first electrode EL1, a hole transport region HTR, an emission layer EML, an electron transport region ETR, and a second electrode EL2.

The first electrode EL1 has conductivity. The first electrode EL1 may be a pixel electrode or an anode. The first electrode EL1 may be a transmissive electrode, a transflective electrode, or a reflective electrode. In case the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In an implementation, the first electrode EL1 may have a structure including a plurality of layers including a reflective layer or transflective layer formed using the above materials, and a transparent conductive layer formed using ITO, IZO, ZnO, or ITZO.

The hole transport region HTR is disposed on the first electrode EL1. The hole transport region HTR may include at least one of a hole injection layer HIL, a hole transport layer HTL, a hole buffer layer, or an electron blocking layer EBL. The thickness of the hole transport region HTR may be from about 1,000 Å to about 1,500 Å, for example.

Hereinafter, a case where the heterocyclic compound according to an embodiment of the present disclosure is included in a hole transport region HTR, will be explained. In an implementation, the heterocyclic compound according to an embodiment of the present disclosure may be included in at least one organic layer provided between the first electrode EL1 and the second electrode EL2. In an implementation, the heterocyclic compound according to an embodiment of the present disclosure may be included in the emission layer EML.

The hole transport region HTR may include the heterocyclic compound according to an embodiment of the present disclosure. In an implementation, the hole transport region HTR may include the heterocyclic compound represented by the following Formula 1.

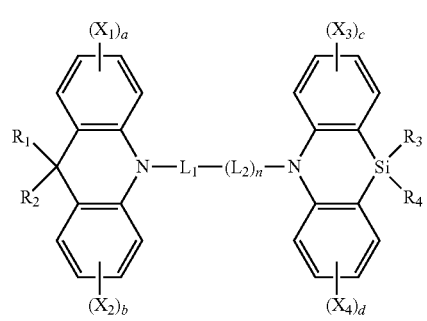

[Formula 1]

In Formula 1, particular explanation on $X_1$ to $X_4$, $R_1$ to $R_4$, $L_1$, $L_2$, "a" to "d" and n is the same as described above, and will be omitted.

The hole transport region HTR may have a single layer formed using a single material, a single layer formed using a plurality of different materials, or a multilayer structure including a plurality of layers formed using a plurality of different materials.

In case the hole transport region HTR has a multilayer structure, a layer in the multilayer structure contacting with the emission layer EML may include the heterocyclic compound according to an embodiment of the present disclosure. For example, when the hole transport region HTR includes a hole injection layer HIL disposed on the first electrode EL1, a hole transport layer HTL disposed on the hole injection layer HIL and an electron blocking layer EBL disposed on the hole transport layer HTL, the heterocyclic compound according to an embodiment of the present disclosure may be included in the electron blocking layer EBL. The electron blocking layer EBL may include one or more heterocyclic compound according to an embodiment of the present disclosure.

In an implementation, the hole transport region HTR may have a single layer structure of a hole injection layer HIL or a hole transport layer HTL, or may have a single layer structure formed using a hole injection material and a hole transport material. In an implementation, the hole transport region HTR may have a single layer structure formed using a plurality of different materials, or a laminated structure of hole injection layer HIL/hole transport layer HTL, hole injection layer HIL/hole transport layer HTL/hole buffer layer, hole injection layer HIL/hole buffer layer, or hole transport layer HTL/hole buffer layer, laminated in order from the first electrode EL1.

The heterocyclic compound according to an embodiment of the present disclosure may have a relatively high level of the lowest triplet excitation energy. For example, the heterocyclic compound according to an embodiment of the present disclosure may have the lowest triplet excitation energy of about 3.0 eV or higher, about 3.1 eV or higher, or about 3.2 eV or higher. When the heterocyclic compound having a high level of the lowest triplet excitation energy according to an embodiment of the present disclosure is included in a layer contacting with a emission layer EML, the diffusion of triplet excitons formed in the emission layer EML into the hole transport region HTR may be minimized or inhibited, thereby improving the emission efficiency.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HTL may further include, for example, carbazole derivatives such as N-phenyl carbazole and polyvinyl carbazole, fluorine-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphthalen-1-yl)-N,N'-diphenyl-benzidine (NPB), 4,4'-cyclohexylidene bis[N,N-bis(4-methylphenyl) benzenamine](TAPC), 4,4'-bis[N,N'-(3-tolyl)amino]-3,3'-dimethylbiphenyl (HMTPD), etc.

The thickness of the hole transport region HTR may be from about 100 Å to about 10,000 Å, for example, from about 100 Å to about 1,000 Å. In case the hole transport region HTR includes all of the hole injection layer HIL, the hole transport layer HTL and the electron blocking layer EBL, the thickness of the hole injection layer HIL may be from about 100 Å to about 10,000 Å, for example, from about 100 Å to about 1,000 Å, the thickness of the hole transport layer HTL may be from about 30 Å to about 1,000 Å, and the thickness of the electron blocking layer EBL may be from about 30 Å to about 120 Å. In case the thicknesses of the hole transport region HTR, the hole injection layer HIL, the hole transport layer HTL and the electron blocking layer EBL satisfy the above-described ranges, satisfactory hole transport properties may be obtained without the substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds. Examples of the p-dopant may include quinone derivatives such as tetracyanoquinodimethane (TCNQ), and 2,3,5,6-tetrafluoro-tetracyanoquinodimethane (F4-TCNQ), metal oxides such as tungsten oxide and molybdenum oxide.

The hole transport region HTR may further include additional layers. For example, the hole transport region HTR may further include a hole buffer layer. The hole buffer layer may compensate an optical resonance distance according to the wavelength of light emitted from the emission layer EML and increase light emission efficiency. Materials included in the hole transport region HTR may be used as materials included in the hole buffer layer.

The emission layer EML is disposed on the hole transport region HTR. The emission layer EML emits fluorescent or phosphorescent light, and the thickness of the emission layer EML may be, for example, from about 100 Å to about 600 Å.

The emission layer EML may have a single layer formed using a single material, a single layer formed using a plurality of different materials, or a multilayer structure having a plurality of layers formed using a plurality of different materials.

The material of the emission layer EML may be any emission material commonly used without specific limitation and may be selected from fluoranthene derivatives, pyrene derivatives, arylacetylene derivatives, fluorene derivatives, perylene derivatives, chrysene derivatives, anthracene derivatives or the like, and preferably, from pyrene derivatives, perylene derivatives, or anthracene derivatives.

The emission layer EML may include a fluorescent material including any one selected from the group consisting of spiro-DPVBi, 2,2',7,7'-tetrakis(biphenyl-4-yl)-9,9'-spirobifluorene(spiro-sexiphenyl) (spiro-6P), distyryl-benzene (DSB), distyryl-arylene (DSA), polyfluorene (PFO)-based polymer and poly(p-phenylene vinylene) (PPV)-based polymer, for example.

The emission layer EML may further include a dopant, and the material of the dopant may be any material commonly used. The dopant may include, for example, 10-phenyl-10H,10'H-spiro[acridine-9,9'-anthracen]-10'-one (ACRSA), styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBPe)), pyrene and the derivatives thereof (for example, 1,1-dipyrene, 1,4-dipyrenylbenzene, 1,4-bis(N,N-diphenylamino)pyrene), 2,5,8,11-tetra-t-butylperylene (TBP), 1,3,5-tris(N-phenylbenzimidazol-2-yl) benzene (TPBi), etc.

The emission layer EML may include, for example, tris(8-hydroxyquinolino)aluminum (Alq$_3$), 4,4'-bis(N-carbazolyl)-1,1'-biphenyl (CBP), poly(N-vinylcarbazole) (PVK), 9,10-di(naphthalen-2-yl)anthracene (ADN), 4,4',4"-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis (triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), etc.

The electron transport region ETR is provided on the emission layer EML. The electron transport region ETR may include at least one of a hole blocking layer, an electron transport layer ETL or an electron injection layer EIL.

The electron transport region ETR may have a single layer formed using a single material, a single layer formed using a plurality of different materials, or a multilayer structure having a plurality of layers formed using a plurality of different materials.

In an implementation, the electron transport region ETR may have a single layer structure of the electron injection layer EIL or the electron transport layer ETL, or a single layer structure formed using an electron injection material and an electron transport material. In an implementation, the electron transport region ETR may have a single layer structure having a plurality of different materials, or a laminated structure of electron transport layer ETL/electron injection layer EIL, or hole blocking layer/electron transport layer ETL/electron injection layer EIL, laminated in order from the emission layer EML. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the electron transport region ETR includes the electron transport layer ETL, the electron transport region ETR may include tris(8-hydroxyquinolinato)aluminum (Alq3), 1,3,5-tri[(3-pyridyl)-phen-3-yl]benzene, 2.4.6-tris (3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,08)-(1,1'-biphenyl-4-olato)aluminum (BAlq), berylliumbis(benzoquinolin-10-olate (Bebq$_2$), 9,10-di(naphthalene-2-yl) anthracene (ADN), or a mixture thereof. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

In case the electron transport region ETR includes the electron injection layer EIL, the electron transport region ETR may use LiF, lithium quinolate (LiQ), Li$_2$O, BaO, NaCl, CsF, a metal in lanthanoids such as Yb, or metal halides such as RbCl and RbI. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. In case the thickness of the electron injection layer EIL satisfies the above described range, satisfactory electron injection properties may be obtained without inducing the substantial increase of a driving voltage.

The electron transport region ETR may include a hole blocking layer as described above. The hole blocking layer may include, for example, at least one of bis[2-(diphenylphosphino)phenyl]ether oxide (DPEPO), 2,9-dimethyl-4,7-diphenyl-1,10-phenanthroline (BCP), or 4,7-diphenyl-1,10-phenanthroline (Bphen).

The second electrode EL2 is disposed on the electron transport region ETR. The second electrode EL2 may be a common electrode or a cathode. The second electrode EL2 may be a transmissive electrode, a transflective electrode or a reflective electrode. In case the second electrode EL2 is the transmissive electrode, the second electrode EL2 may be formed using transparent metal oxides, for example, ITO, IZO, ZnO, ITZO, etc.

In case the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In an implementation, the second electrode EL2 may be connected with an auxiliary electrode. In case the second electrode EL2 is connected with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to generate excitons, and light may be emitted via the transition of the excitons from an excited state to a ground state.

In case the organic electroluminescence device 10 is a top emission type, the first electrode EL1 may be a reflective electrode, and the second electrode EL2 may be a transmissive electrode or a transflective electrode. In case the organic electroluminescence device 10 is a bottom emission type, the first electrode EL1 may be a transmissive electrode or a transflective electrode, and the second electrode EL2 may be a reflective electrode.

The organic electroluminescence device according to an embodiment of the present disclosure includes the heterocyclic compound represented by Formula 1 in the hole transport region (e.g., in a layer contacting with the emission layer), thereby securing high efficiency.

Hereinafter, the present disclosure will be explained in more detail with reference to embodiments and comparative embodiments. The following embodiments are illustrated only for assisting the understanding of the present disclosure, and the scope of the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Examples

The heterocyclic compounds according to an embodiment of the present disclosure may be synthesized, e.g., as follows.

1. Synthesis of Compound 1
Compound 1 was synthesized by the following reaction.
(Synthesis of Compound C)

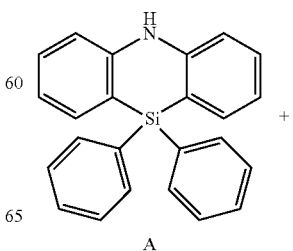

A

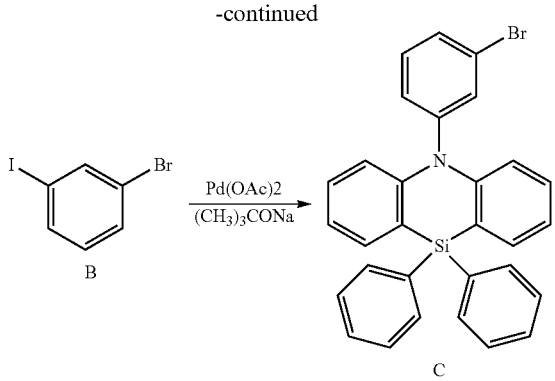

Under an argon (Ar) atmosphere, 200 mL of toluene and 1.0 g of Xantphos were added in order to a mixture of 6.0 g of Compound A, 4.9 g of Compound B, 0.39 g of palladium acetate and 4.95 g of sodium-tert-butoxide, and the resulting mixture was heated to reflux for about 8 hours. After cooling to ambient temperature, the reaction solution was filtered and 100 mL of ethanol was added to the filtrate. Precipitated crystals were filtered and washed in order with 50 mL of water and 100 mL of ethanol to obtain 9.3 g (yield 78%) of Compound C as a light yellow powder.

(Synthesis of Compound 1)

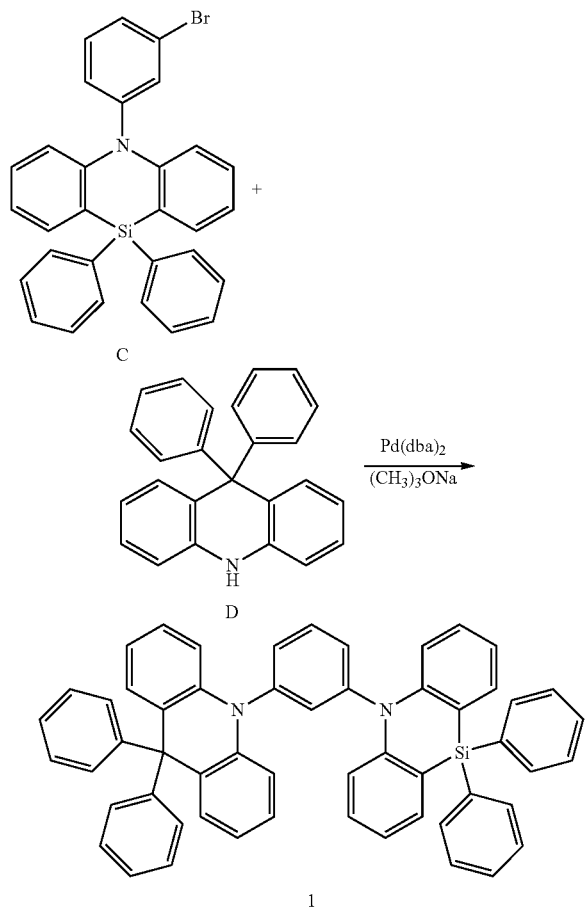

Under an argon (Ar) atmosphere, 100 mL of toluene and 1.0 mL of 2M tri(tert-butyl)phosphine in toluene were added in order to a mixture of 16.75 g of Compound C, 4.49 g of Compound D, 0.18 g of palladium(0) bis(dibenzylideneacetone) and 3.9 g of sodium-tert-butoxide, and the resulting mixture was heated to reflux for about 5 hours. After cooling to ambient temperature, the reaction solution was filtered and 100 mL of ethanol was added to the filtrate. Precipitated crystals were purified by column chromatography (toluene:hexane 1:1) and the concentrated dried solid was recrystallized with toluene/ethanol to obtain 9.3 g (yield 92%) of Compound 1 as a white powder. The molecular weight of Compound 1 measured by FAB-MS is as follows.

(M/z 756.3 (M+), 757.3 (MH+))

2. Synthesis of Compound 3

(Synthesis of Compound F)

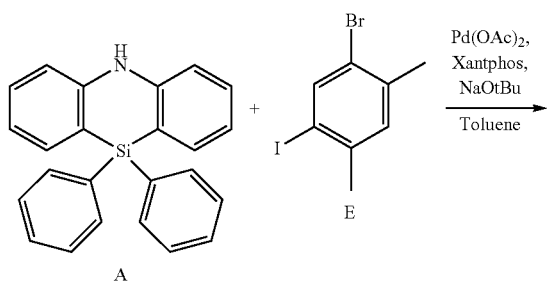

Under an argon (Ar) atmosphere, 200 mL of toluene and 1.0 g of Xantphos were added in order to a mixture of 6.0 g of Compound A, 4.9 g of Compound E, 0.39 g of palladium acetate and 4.95 g of sodium-tert-butoxide, and the resulting mixture was heated to reflux for about 8 hours. After cooling to ambient temperature, the reaction solution was filtered and 100 mL of ethanol was added to the filtrate. Precipitated crystals were filtered and washed in order with 50 mL of water and 100 mL of ethanol. The crystals were dissolved in toluene and purified by silica gel column chromatography (toluene:hexane 1:1) to obtain 3.8 g (yield 41%) of Compound F as a light yellow powder.

(Synthesis of Compound 3)

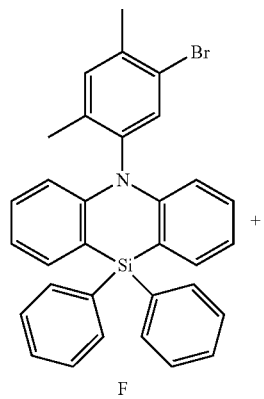

F

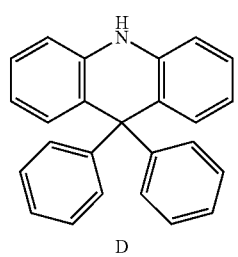

D

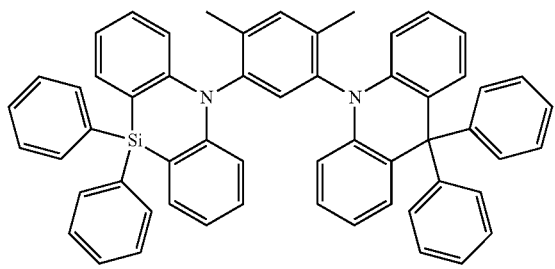

3

Under an argon (Ar) atmosphere, 100 mL of toluene and 1.0 mL of 2M tri(tert-butyl)phosphine in toluene were added in order to a mixture of 3.84 g of Compound F, 2.40 g of Compound D, 0.18 g of palladium(0) bis(dibenzylideneacetone) and 2.1 g of sodium-tert-butoxide, and the resulting mixture was heated to reflux for about 5 hours. After cooling to ambient temperature, the reaction solution was filtered and 100 mL of ethanol was added to the filtrate. Precipitated crystals were purified by column chromatography (toluene:hexane 1:1) and the concentrated dried solid was recrystallized with toluene/ethanol to obtain 4.4 g (yield 81%) of Compound 3 as a white powder. The molecular weight of Compound 1 measured by FAB-MS is as follows.

(M/z 784.3 (M+), 785.3 (MH+))

3. Synthesis of Compound 11
(Synthesis of Compound G)

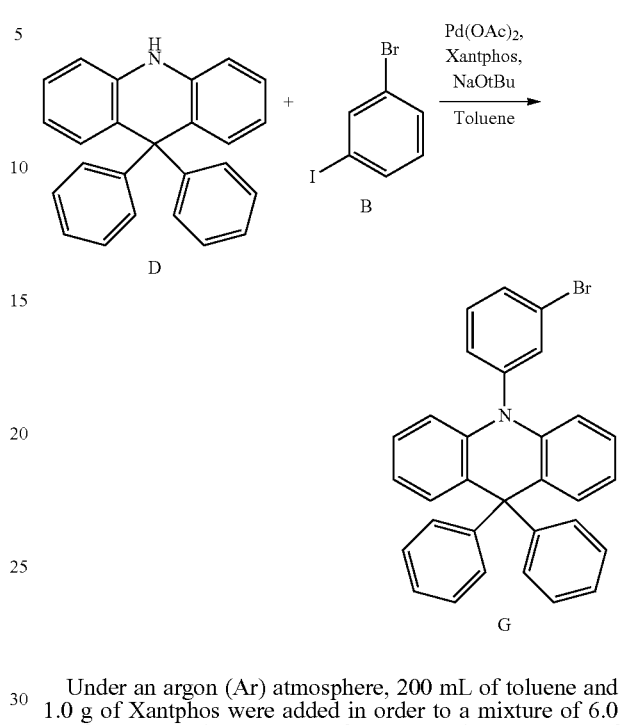

Under an argon (Ar) atmosphere, 200 mL of toluene and 1.0 g of Xantphos were added in order to a mixture of 6.0 g of Compound D, 5.1 g of Compound B, 0.39 g of palladium acetate and 5.2 g of sodium-tert-butoxide, and the resulting mixture was heated to reflux for about 8 hours. After cooling to ambient temperature, the reaction solution was filtered and 100 mL of ethanol was added to the filtrate. Precipitated crystals were filtered and washed in order with 50 mL of water and 100 mL of ethanol. The crystals were dissolved in toluene and purified by silica gel column chromatography (toluene:hexane 1:1) to obtain 7.2 g (yield 81%) of Compound G as a light yellow powder.

(Synthesis of Compound 1)

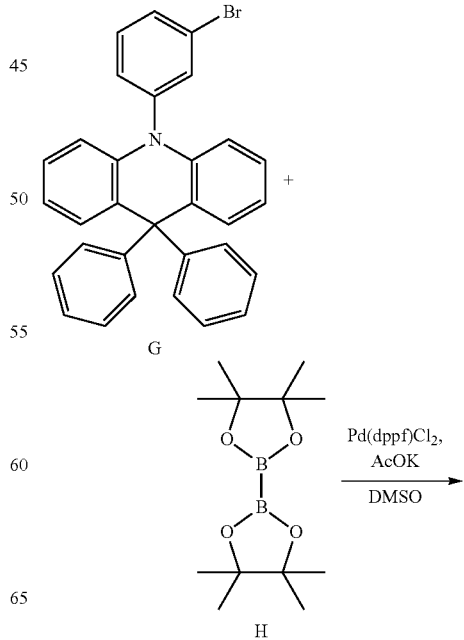

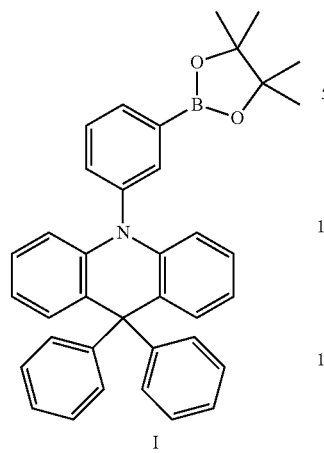

I

Under an argon (Ar) atmosphere, 100 mL of DMSO was added to a mixture of 7.2 g of Compound G, 6.6 g of Compound H, 0.53 g of [1,1"-bis(diphenylphosphino)ferrocene]palladium(II) dichloride and 6.2 g of potassium acetate, and the resulting mixture was heated to reflux for about 8 hours. After cooling to ambient temperature, the reaction solution was added with 500 mL of water and the resulting precipitate was filtered. The filtered precipitate was dissolved in toluene and purified by silica gel column chromatography (toluene:hexane 1:1) to obtain 8.1 g (yield 70%) of Compound 1 as a brown powder.

(Synthesis of Compound 11)

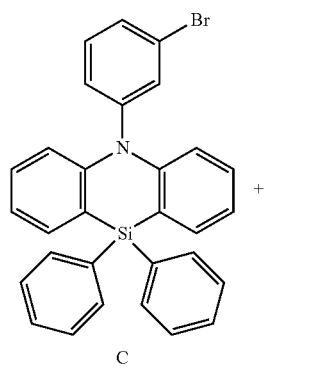

C

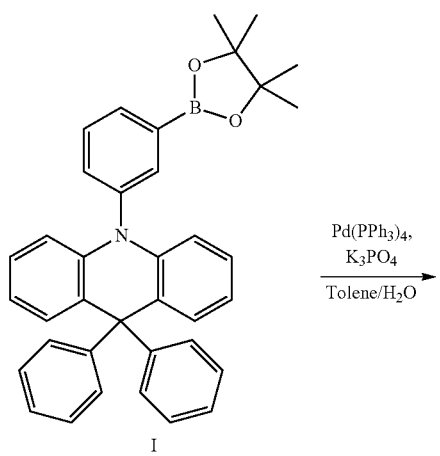

I

Pd(PPh3)4, K3PO4
———————→
Tolene/H2O

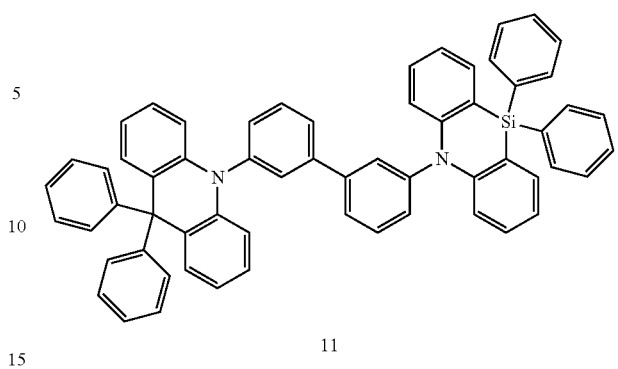

11

Under an argon (Ar) atmosphere, 100 mL of toluene, 5 mL of water and 5 mL of ethanol were added to a mixture of 4.0 g of Compound C, 4.2 g of Compound 1, 0.2 g of tetrakis(triphenylphosphine)palladium and 5.1 g of potassium phosphate, and the resulting mixture was heated to reflux for about 8 hours. After cooling to ambient temperature, the reaction solution was filtered and 100 mL of ethanol was added to the filtrate. Precipitated crystals were filtered and washed in order with 50 mL of water and 100 mL of ethanol. The crystals were dissolved in toluene and purified by silica gel column chromatography (toluene:hexane 1:1) to obtain 3.43 g (yield 52%) of Compound 11 as a white powder. The molecular weight of Compound 11 measured by FAB-MS is as follows.

(M/z 832.3 (M+), 833.3 (MH+))

Device Manufacturing Examples

Organic electroluminescence devices of Examples 1 to 3 were manufactured by using the above Compounds 1, 3 and 11 as electron blocking layer materials.

Example Compounds

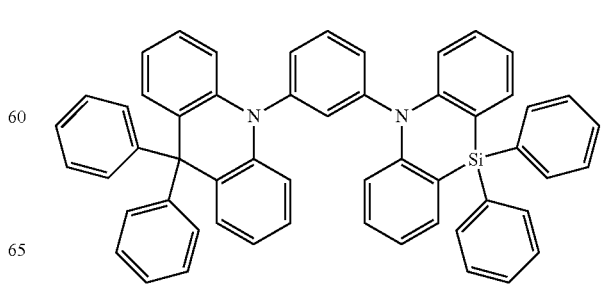

1

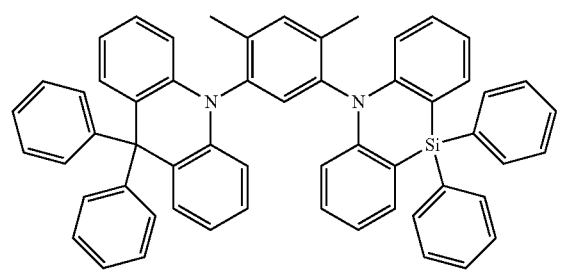
3
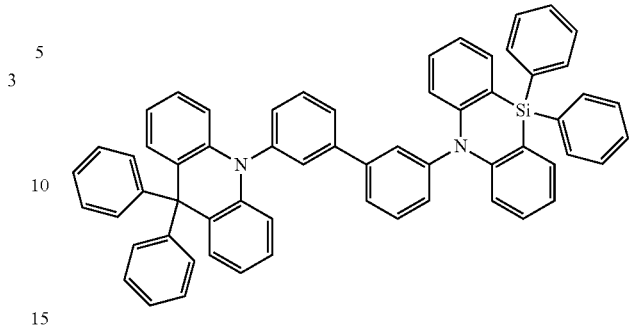
Organic electroluminescent devices of Comparative Examples 1 to 6 were manufactured by using the following Comparative Compounds c1 to c6 as electron blocking layer materials.
[Comparative Compounds]
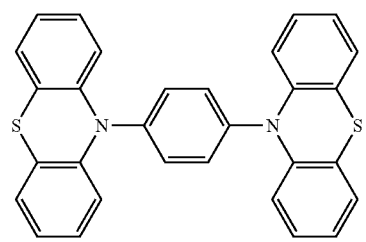
c1
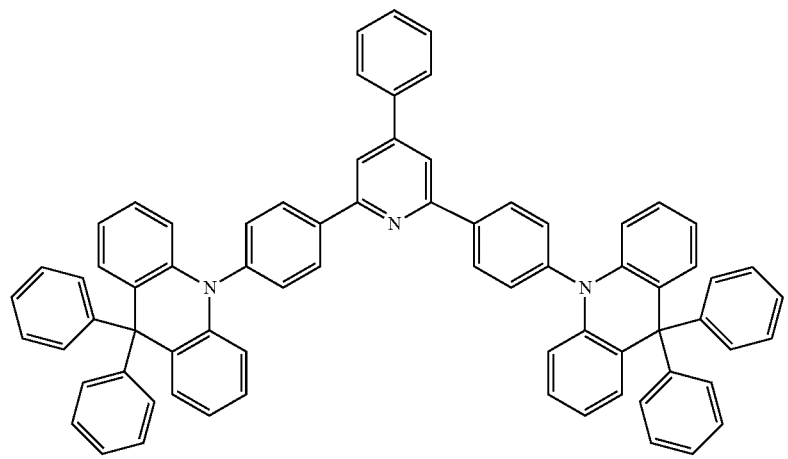
c2
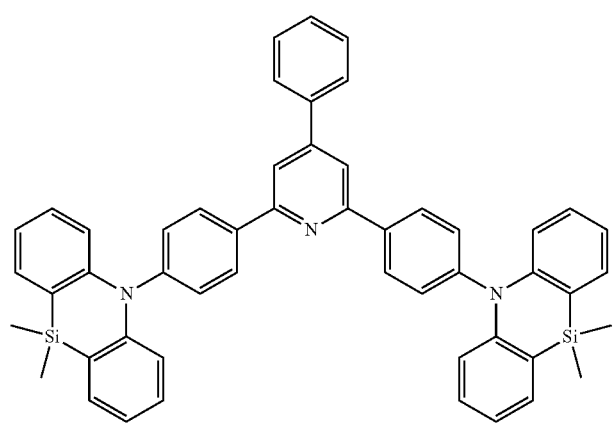
c3

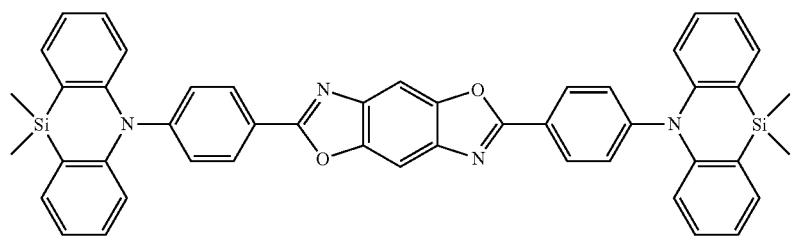

c4

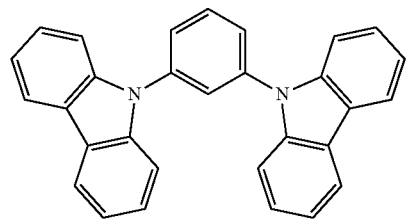

c5

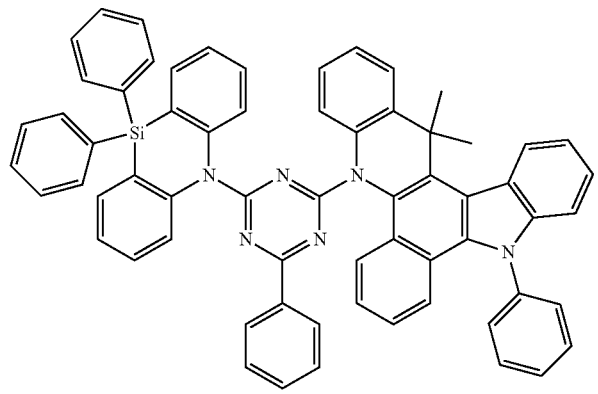

c6

The organic electroluminescence devices according to Examples 1 to 3 and Comparative Examples 1 to 6 were manufactured by forming a first electrode using ITO to a thickness of about 150 nm, a hole injection layer using HAT-CN to a thickness of about 10 nm, a hole transport layer using α-NPD to a thickness of about 80 nm, an electron blocking layer using the example compounds or the comparative compounds to a thickness of about 5 nm, an emission layer using DPEPO doped with 18% ACRSA to a thickness of about 20 nm, a hole blocking layer using DPEPO to a thickness of about 10 nm, an electron transport layer using TPBi to a thickness of about 30 nm, an electron injection layer using LiF to a thickness of about 0.5 nm, and a second electrode using Al to a thickness of about 100 nm. Each layer was formed by a vacuum deposition method.

The inception voltage and external quantum efficiency of the manufactured organic electroluminescence devices were evaluated. The external quantum efficiency was measured by using a brightness light distribution characteristics measurement system C9920-11 (Hamamatsu Photonics, Japan). Evaluation results are shown in Table 1 below.

TABLE 1

| Device manufacturing example | Electron blocking layer material | Inception voltage (V, 10 mA/cm$^2$) | External quantum efficiency (%) |
|---|---|---|---|
| Example 1 | Example Compound 1 | 6.1 | 17.9 |
| Example 2 | Example Compound 3 | 6.5 | 18.2 |
| Example 3 | Example Compound 11 | 6.0 | 16.7 |
| Comparative Example 1 | Comparative Compound c1 | 5.8 | 3.6 |
| Comparative Example 2 | Comparative Compound c2 | 6.1 | 4.3 |
| Comparative Example 3 | Comparative Compound c3 | 5.8 | 5.2 |
| Comparative Example 4 | Comparative Compound c4 | 5.7 | 3.1 |
| Comparative Example 5 | Comparative Compound c5 | 6.6 | 15.0 |
| Comparative Example 6 | Comparative Compound c6 | 5.7 | 4.3 |

Referring to the results in Table 1, it may be seen that the organic electroluminescence device according to Examples 1 to 3 may attain a high efficiency.

Each of the compounds used in Examples 1 to 3 included one dihydroacridine derivative and one dihydrodibenzo-azasiline derivative on a linker, and has a relatively high level of the lowest triplet excitation energy.

On the other hand, each of the compounds used in Comparative Examples 1 to 5 included two derivatives of the same kind on a linker, and has the lowest triplet excitation energy lower when compared with those used in Examples 1 to 3.

The lowest triplet excitation energy of Example Compounds 1, 3, and 11 and Comparative Compounds c1 to c6 are shown in Table 2 below.

TABLE 2

| | | Lowest triplet excitation energy T1 (eV) |
|---|---|---|
| Example 1 | Example Compound 1 | 3.28 |
| Example 2 | Example Compound 3 | 3.25 |
| Example 3 | Example Compound 11 | 3.22 |

TABLE 2-continued

| | | Lowest triplet excitation energy T1 (eV) |
|---|---|---|
| Comparative Example 1 | Comparative Compound c1 | 2.99 |
| Comparative Example 2 | Comparative Compound c2 | 2.95 |
| Comparative Example 3 | Comparative Compound c3 | 2.98 |
| Comparative Example 4 | Comparative Compound c4 | 2.62 |
| Comparative Example 5 | Comparative Compound c5 | 3.18 |
| Comparative Example 6 | Comparative Compound c6 | 2.55 |

The lowest triplet excitation energy was calculated using TD-B3LYP/631-G (d) by the theoretical chemistry simulation software Gaussian 09.

By including the heterocyclic compound according to an embodiment of the present disclosure into a layer in a hole transport region contacting with an emission layer (e.g., an electron blocking layer), the diffusion/leakage of triplet excitons formed in the emission layer into a hole transport layer may be minimized or inhibited, thereby attaining a high efficiency organic electroluminescence device.

The organic electroluminescence device including the heterocyclic compound according to an embodiment of the present disclosure may have an excellent efficiency.

The embodiments may provide a heterocyclic compound having a high level of the lowest triplet excitation energy and a high efficiency organic electroluminescence device including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by the following Formula 1:

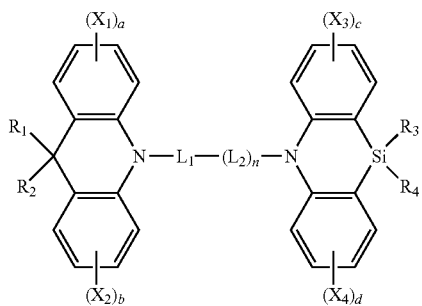

[Formula 1]

wherein in Formula 1, $L_1$ and $L_2$ are each independently a substituted or unsubstituted arylene group having 6 to 30 ring carbon atoms or a substituted or unsubstituted heteroarylene group having 2 to 30 ring carbon atoms, n is 0 or 1, $R_1$ to $R_4$ and $X_1$ to $X_4$ are each independently a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ being separate or forming a ring by combining adjacent groups with each other, $X_1$ to $X_4$ being separate, and a to d are each independently an integer of 0 to 4.

2. The heterocyclic compound as claimed in claim 1, wherein $R_1$ to $R_4$ are each independently a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms.

3. The heterocyclic compound as claimed in claim 1, wherein at least two of $R_1$ to $R_4$ are a substituted or unsubstituted aryl group having 6 to 30 ring carbon atoms.

4. A heterocyclic compound represented by the following Formula 1-1:

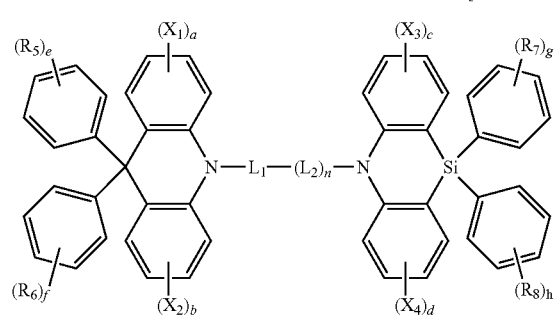

[Formula 1-1]

wherein in Formula 1-1, $R_5$ to $R_8$ are each independently a hydrogen atom, a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms, e to h are each independently an integer of 0 to 4, $L_1$ and $L_2$ are each independently a substituted or unsubstituted arylene group having 6 to 30 ring carbon atoms or a substituted or unsubstituted heteroarylene group having 2 to 30 ring carbon atoms, n is 0 or 1, $X_1$ to $X_4$ are each independently a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $X_1$ to $X_4$ being separate or forming a ring by combining adjacent groups with each other, and a to d are each independently an integer of 0 to 4.

5. The heterocyclic compound as claimed in claim 1, wherein L₁ is a substituted or unsubstituted phenylene group, a substituted or unsubstituted divalent biphenyl group, a substituted or unsubstituted divalent terphenyl group, a substituted or unsubstituted fluorenylene group, or a heteroarylene group having at least one nitrogen atom (N) as a heteroatom.

6. The heterocyclic compound as claimed in claim 5, wherein n is 0.

7. The heterocyclic compound as claimed in claim 1, wherein:

n is 1,

L₁ is a substituted or unsubstituted arylene group having 6 to 30 ring carbon atoms, and L₂ is a substituted or unsubstituted heteroarylene group having 2 to 30 ring carbon atoms.

8. The heterocyclic compound as claimed in claim 7, wherein L₂ is a substituted or unsubstituted carbazole group, a substituted or unsubstituted dibenzofuran group, or a substituted or unsubstituted dibenzothiophene group.

9. The heterocyclic compound as claimed in claim 1, wherein L₁ is a group represented by one of the following Formulae L₁₋₁ to L₁₋₁₁:

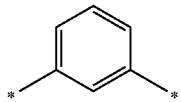
L₁₋₁

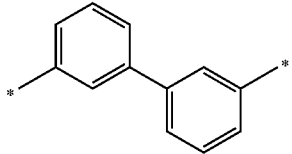
L₁₋₂

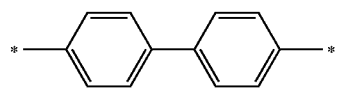
L₁₋₃

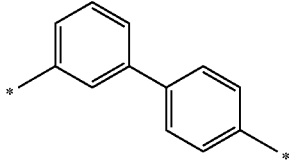
L₁₋₄

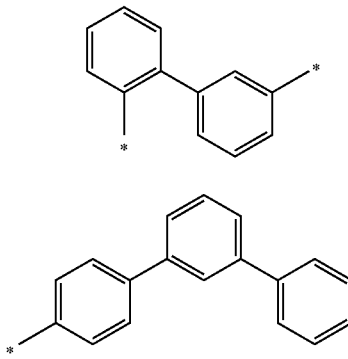
L₁₋₅

L₁₋₆

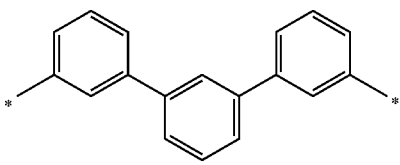
L₁₋₇

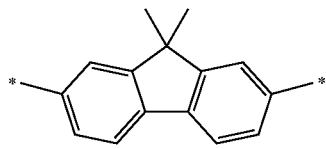
L₁₋₈

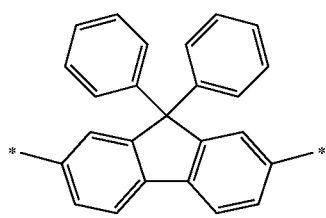
L₁₋₉

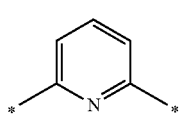
L₁₋₁₀

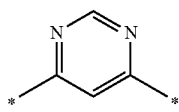
L₁₋₁₁ wherein Formulae L₁₋₁ to L₁₋₁₁ are each independently unsubstituted or substituted with a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms.

10. The heterocyclic compound as claimed in claim 1, wherein the heterocyclic compound represented by Formula 1 is a compound of the following Compound Group 1:

[Compound Group 1]

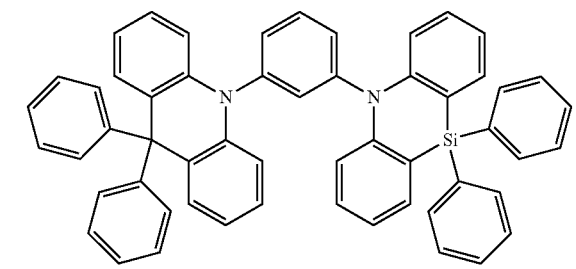
1

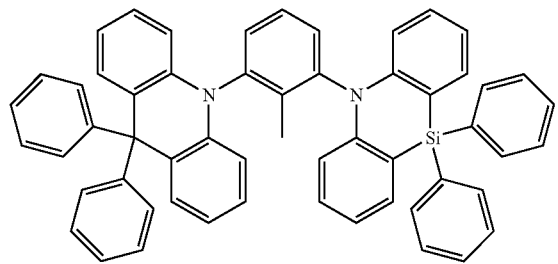
2
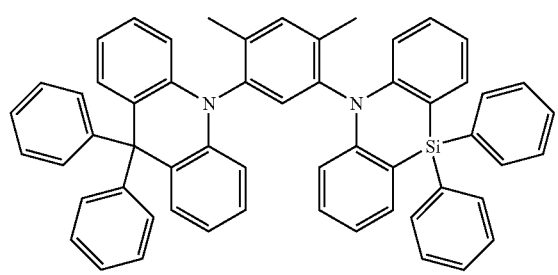
3
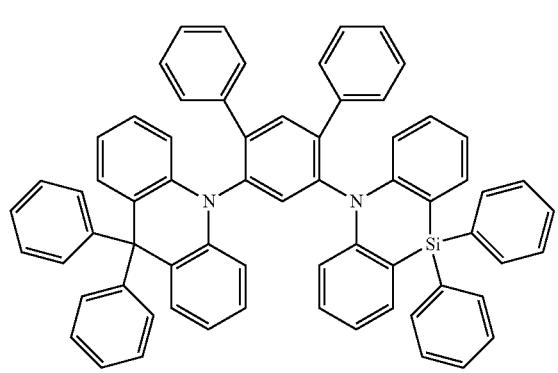
4
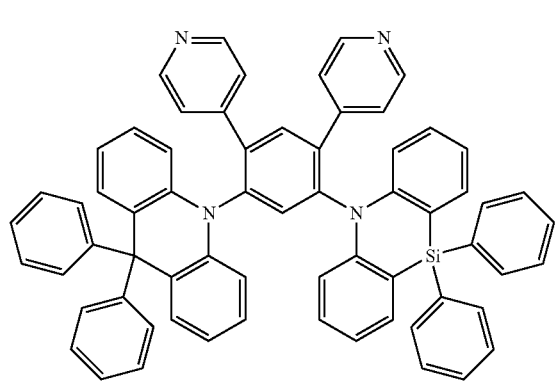
5
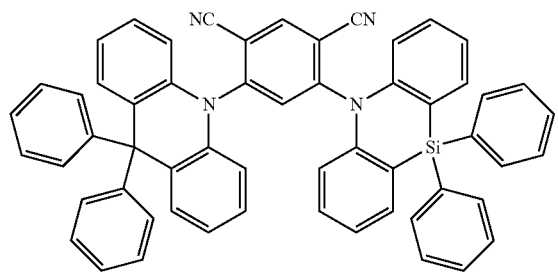
6
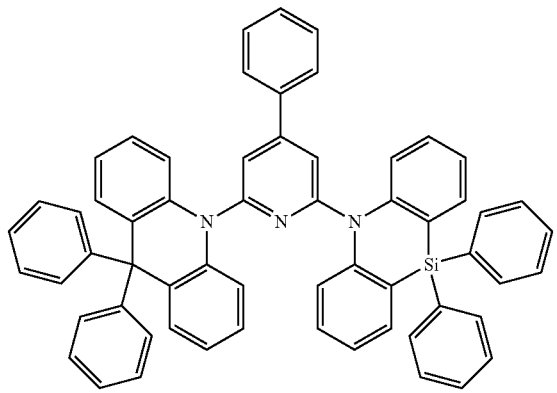
7
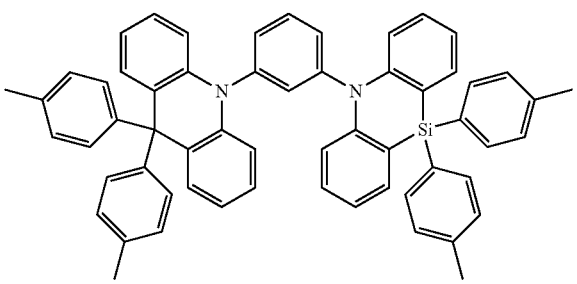
8
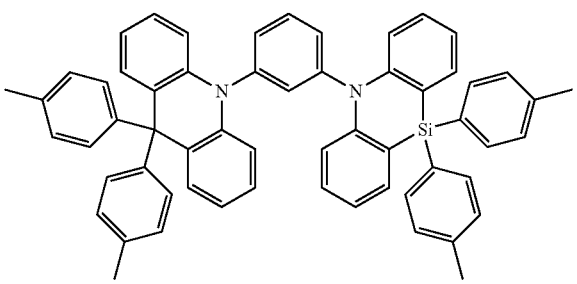
9
10

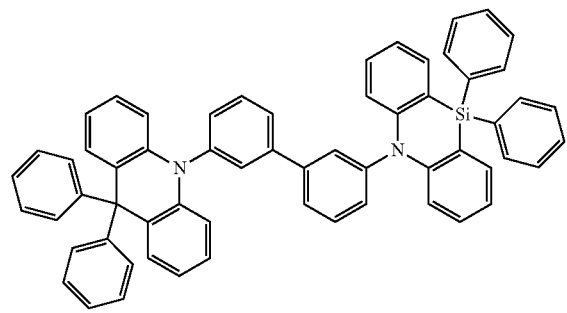
11
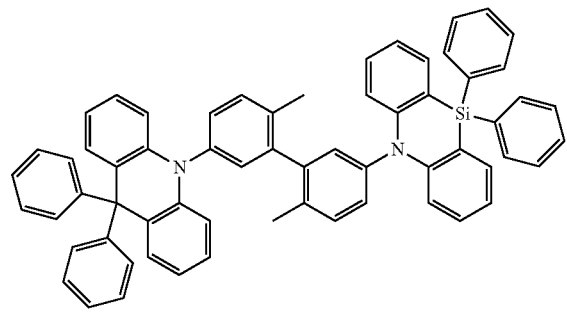
12
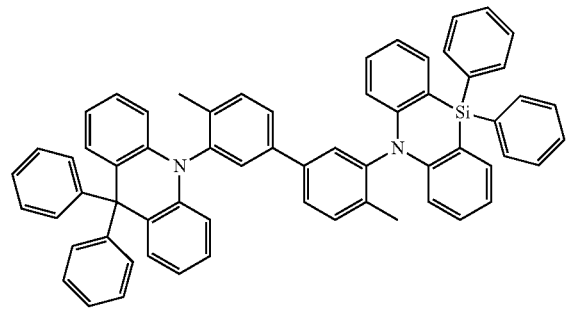
13
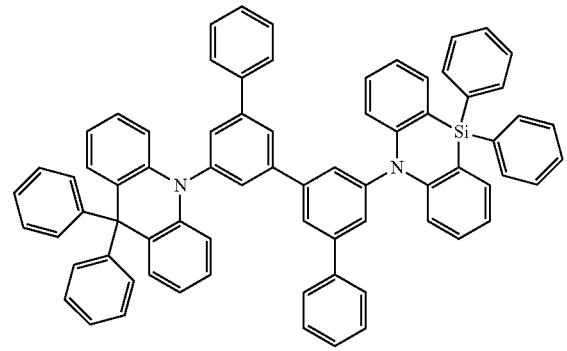
14
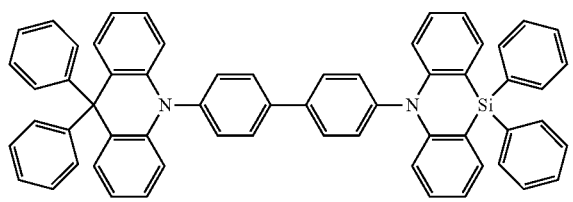
15
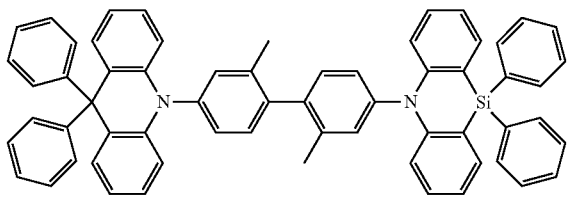
16
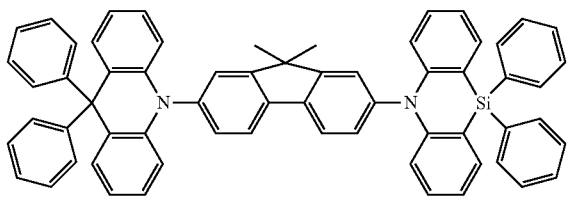
17
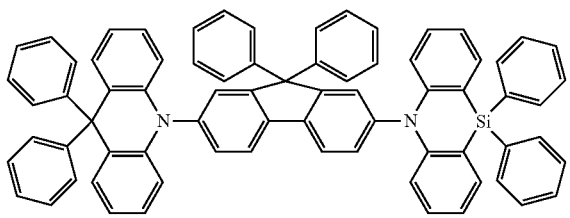
18
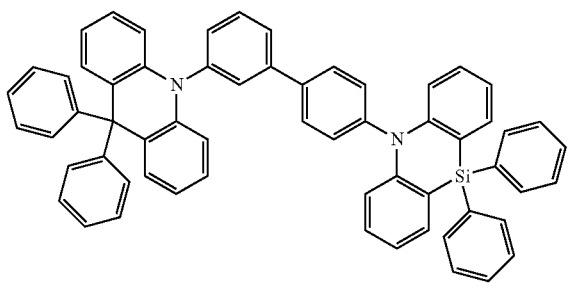
19
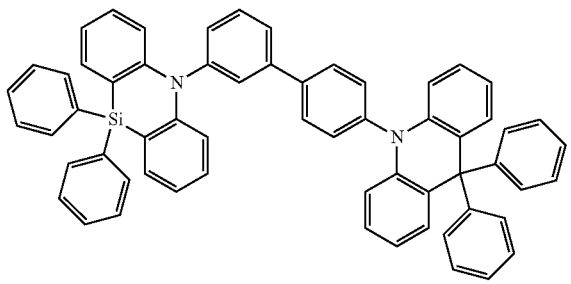
20
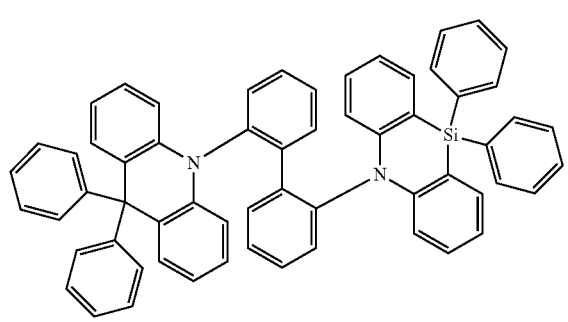
21

22
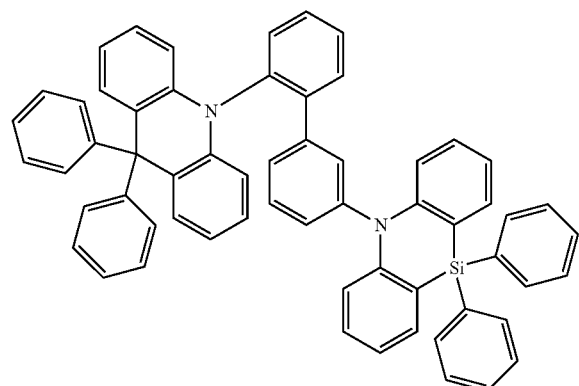
23
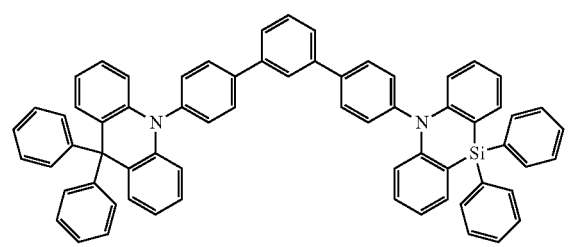
24
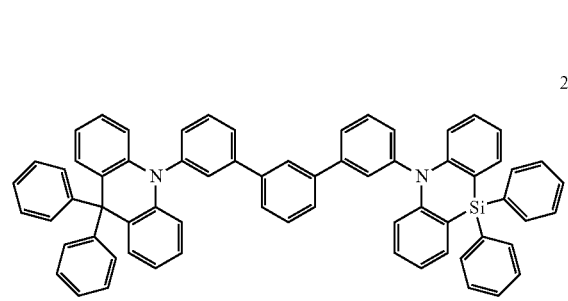
25
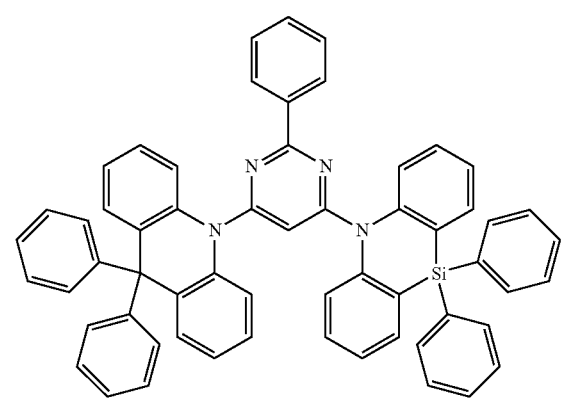
26
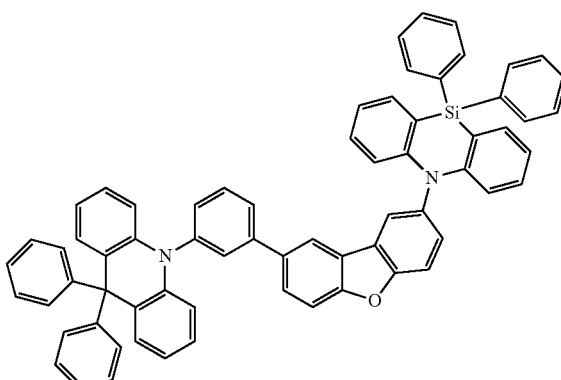
27
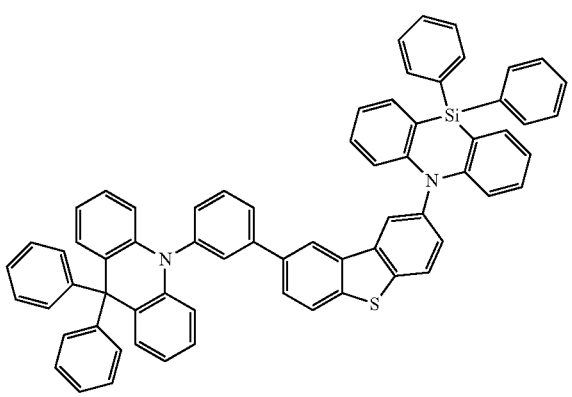
28
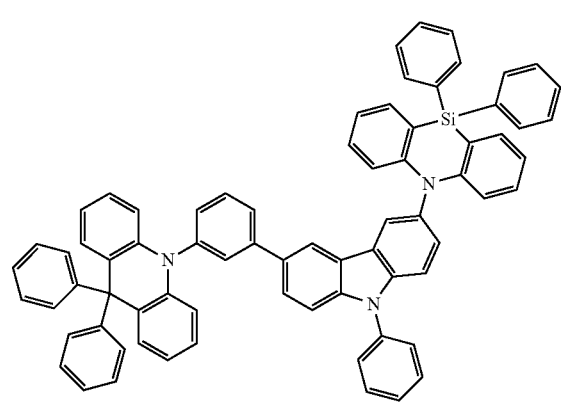
29
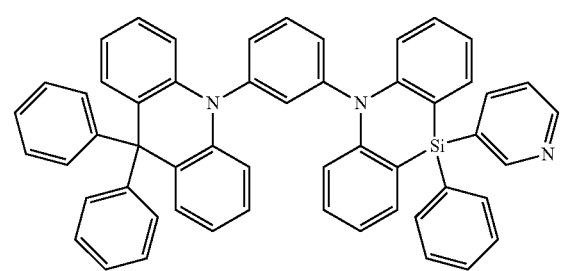

30
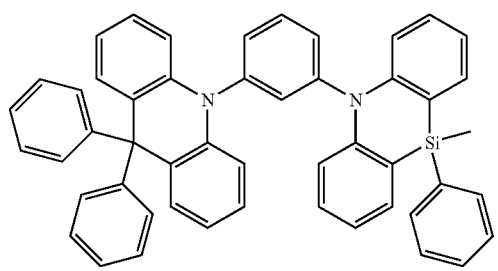
31
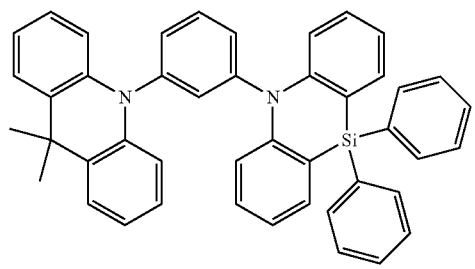
32
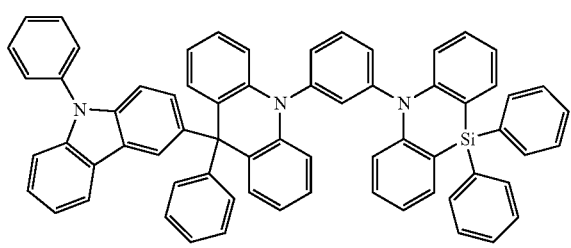
33
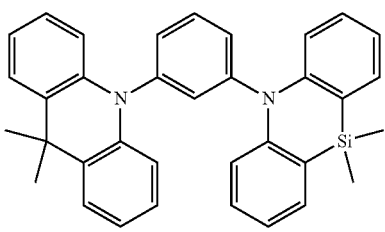
34
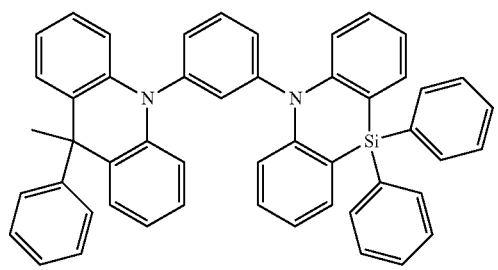
35
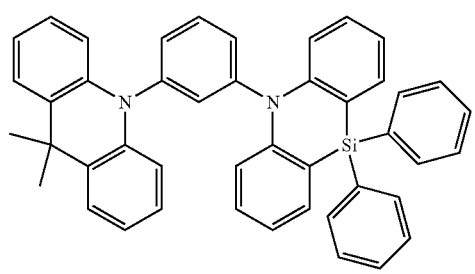
36
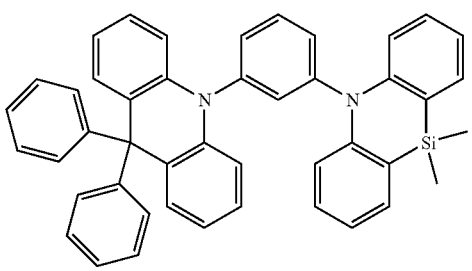
37
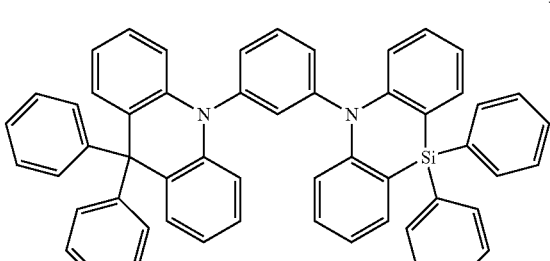
38
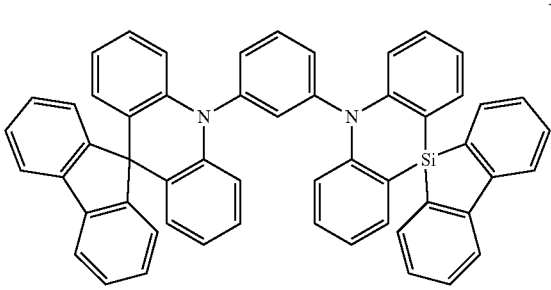
39
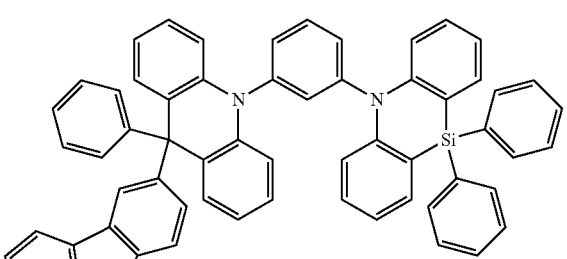
40
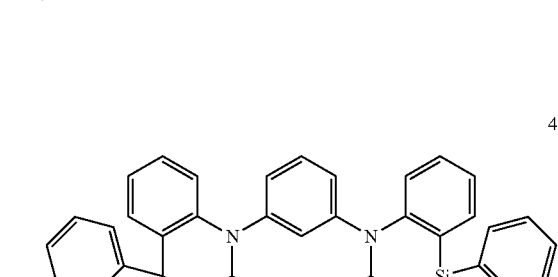

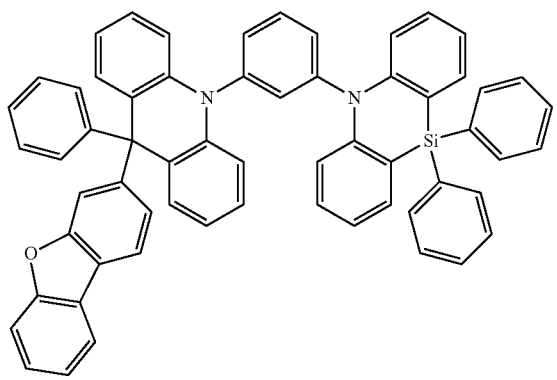

41

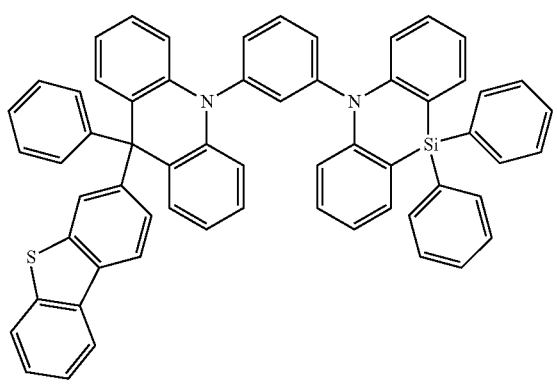

42

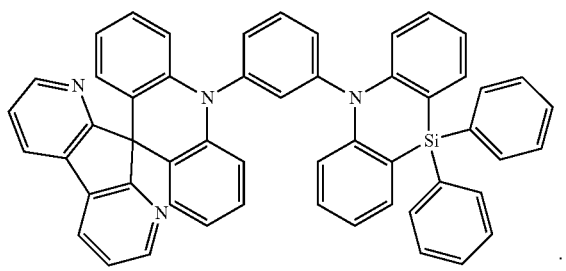

43

11. An organic electroluminescence device, comprising:
a first electrode;
a hole transport region on the first electrode;
an emission layer on the hole transport region;
an electron transport region on the emission layer; and
a second electrode on the electron transport region,
wherein the hole transport region includes a heterocyclic compound represented by the following Formula 1:

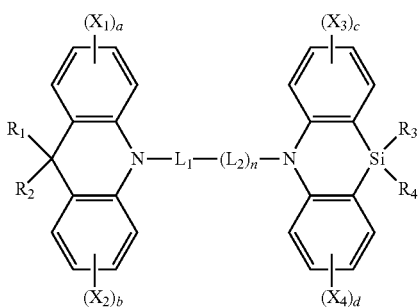

[Formula 1]

wherein in Formula 1, $L_1$ and $L_2$ are each independently a substituted or unsubstituted arylene group having 6 to 30 ring carbon atoms or a substituted or unsubstituted heteroarylene group having 2 to 30 ring carbon atoms, n is 0 or 1, $R_1$ to $R_4$ and $X_1$ to $X_4$ are each independently a hydrogen atom, a deuterium atom, a halogen atom, a cyano group, a substituted or unsubstituted silyl group, a substituted or unsubstituted alkyl group having 1 to 20 carbon atoms, a substituted or unsubstituted aryl group having 6 to 30 ring carbon atoms, or a substituted or unsubstituted heteroaryl group having 2 to 30 ring carbon atoms, $R_1$ to $R_4$ being separate or forming a ring by combining adjacent groups with each other, $X_1$ to $X_4$ being separate, and a to d are each independently an integer of 0 to 4.

12. The organic electroluminescence device as claimed in claim 11, wherein:

the hole transport region includes a multilayer structure, and a layer in the multilayer structure contacting the emission layer includes the heterocyclic compound represented by Formula 1.

13. The organic electroluminescence device as claimed in claim 11, wherein the hole transport region includes:

a hole injection layer on the first electrode;

a hole transport layer on the hole injection layer; and an electron blocking layer on the hole transport layer, and the electron blocking layer includes the heterocyclic compound represented by Formula 1.

14. The organic electroluminescence device as claimed in claim 11, wherein $R_1$ to $R_4$ are each independently a substituted or unsubstituted aryl group having 6 to 30 ring carbon atoms or a substituted or unsubstituted heteroaryl group having 2 to 30 ring carbon atoms.

15. The organic electroluminescence device as claimed in claim 11, wherein at least two of $R_1$ to $R_4$ are a substituted or unsubstituted aryl group having 6 to 30 ring carbon atoms.

16. The organic electroluminescence device as claimed in claim 11, wherein the compound represented by Formula 1 is represented by the following Formula 1-1:

[Formula 1-1]

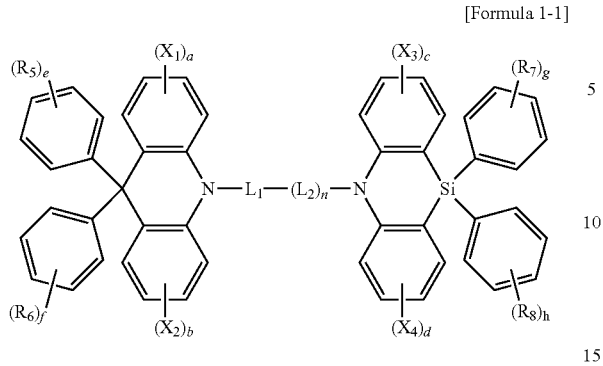

wherein in Formula 1-1,

R₅ to R₈ are each independently a hydrogen atom, a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30 ring carbon atoms, e to h are each independently an integer of 0 to 4, and $L_1$, $L_2$, $X_1$ to $X_4$, "a" to "d," and n are defined the same as those of Formula 1.

17. The organic electroluminescence device as claimed in claim 11, wherein $L_1$ is a substituted or unsubstituted phenylene group, a substituted or unsubstituted divalent biphenyl group, a substituted or unsubstituted divalent terphenyl group, a substituted or unsubstituted fluorenylene group, or a heteroarylene group having at least one nitrogen atom (N) as a heteroatom.

18. The organic electroluminescence device as claimed in claim 11, wherein:

n is 1, $L_1$ is a substituted or unsubstituted arylene group having 6 to 30 ring carbon atoms, and $L_2$ is a substituted or unsubstituted heteroarylene group having 2 to 30 ring carbon atoms.

19. The organic electroluminescence device as claimed in claim 11, wherein $L_1$ is a group represented by one of the following Formulae $L_{1-1}$ to $L_{1-11}$:

$L_{1-1}$

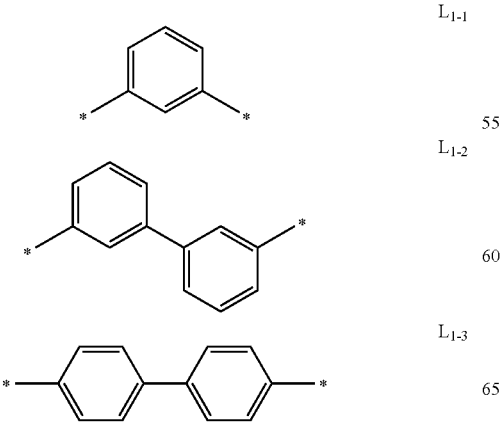

$L_{1-2}$ $L_{1-3}$ $L_{1-4}$

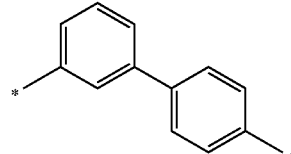

$L_{1-5}$

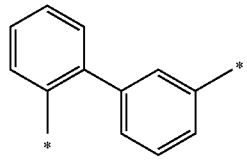

$L_{1-6}$

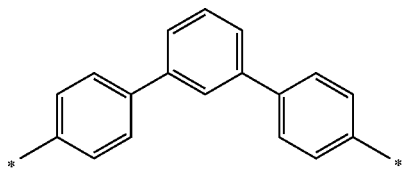

$L_{1-7}$

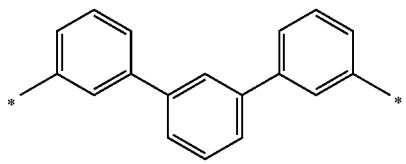

$L_{1-8}$

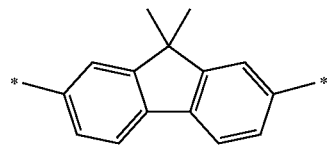

$L_{1-9}$

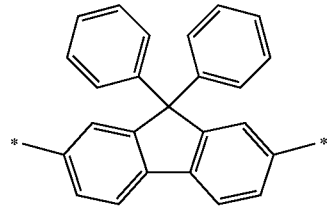

$L_{1-10}$

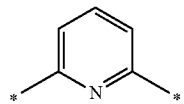

$L_{1-11}$

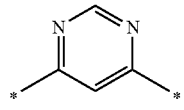

wherein Formulae $L_{1-1}$ to $L_{1-11}$ are each independently unsubstituted or substituted with a deuterium atom, a halogen atom, a cyano group, a substituted or unsubstituted alkyl group having 1 to 10 carbon atoms, a substituted or unsubstituted aryl group having 6 to 15 ring carbon atoms, or a substituted or unsubstituted heteroaryl group having 2 to 30.

20. The organic electroluminescence device as claimed in claim 11, wherein the heterocyclic compound represented by Formula 1 is a compound of the following Compound Group 1:
[Compound Group 1]
1
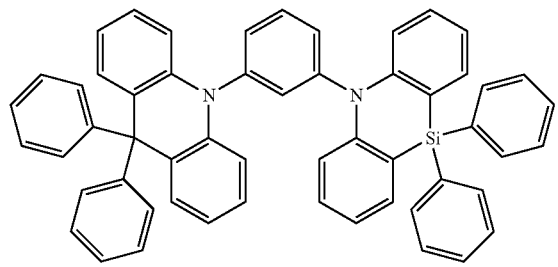
2
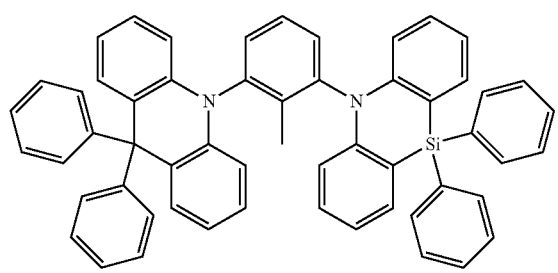
3
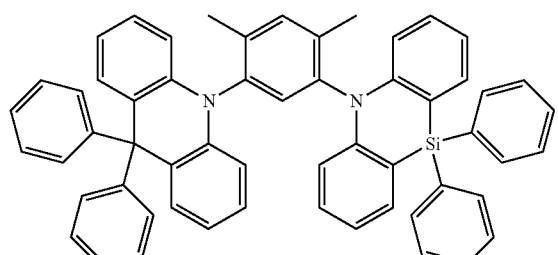
4
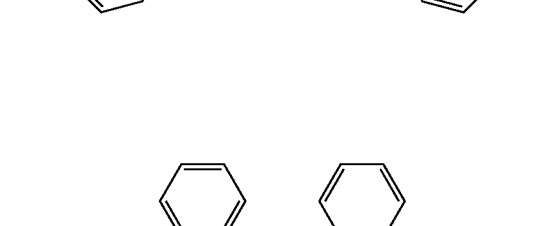
5
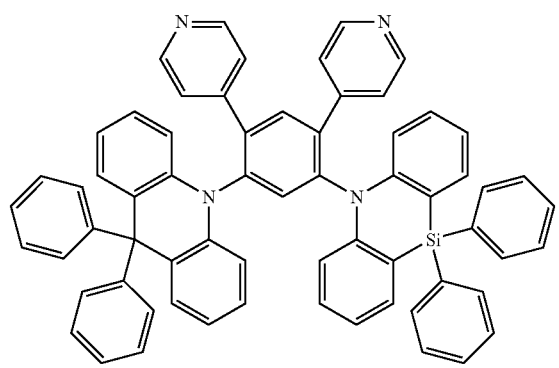
6
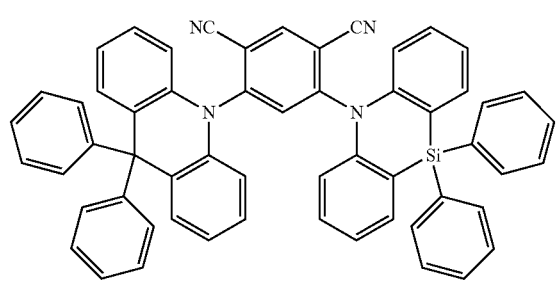
7
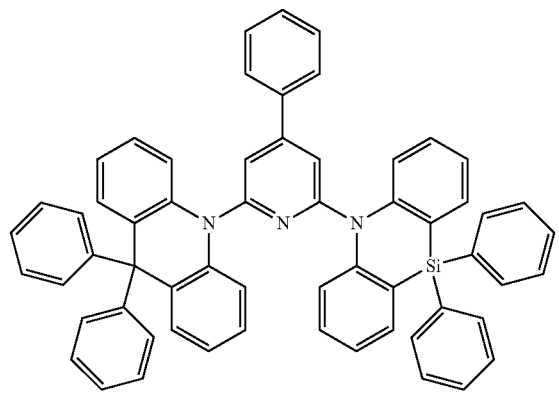
8
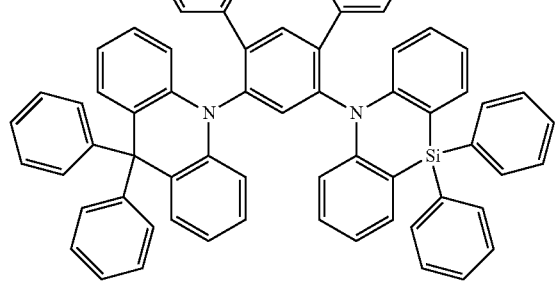

77
-continued
78
-continued
9
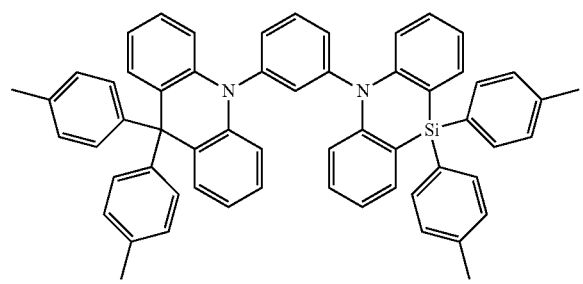
13
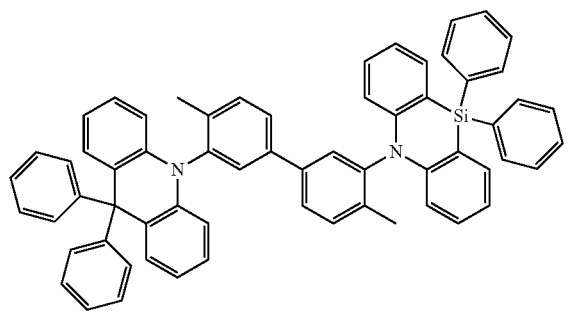
10
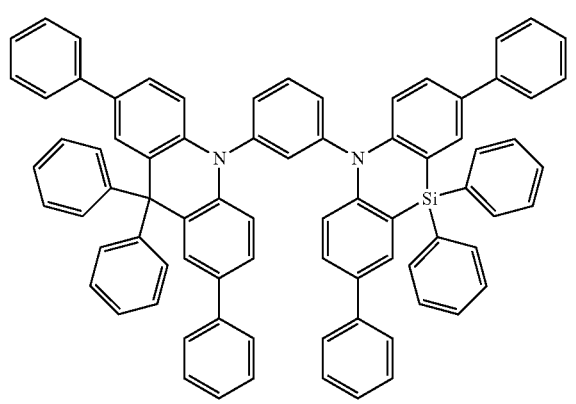
14
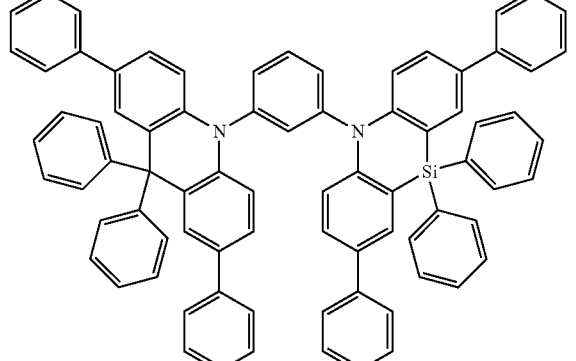
15
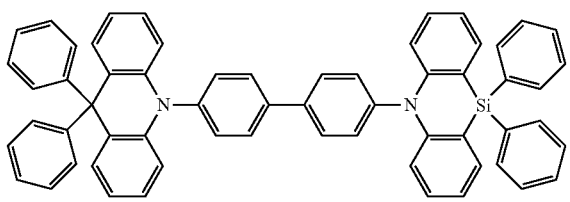
16
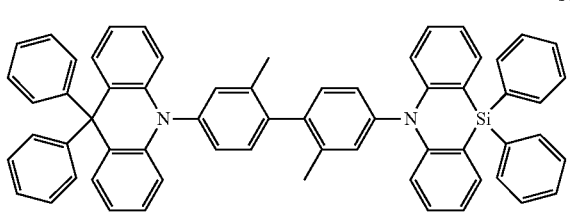
11
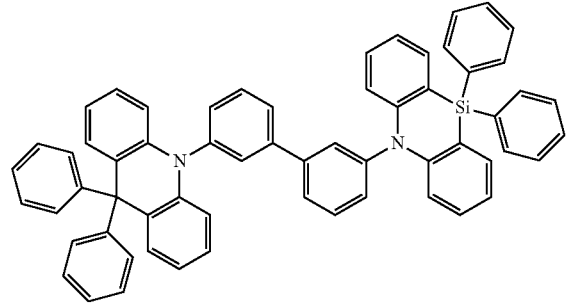
17
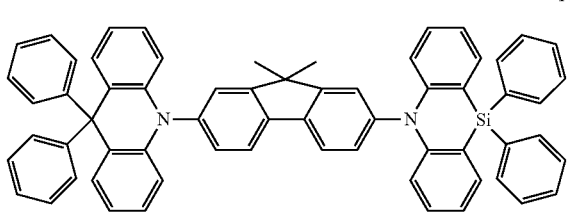
12
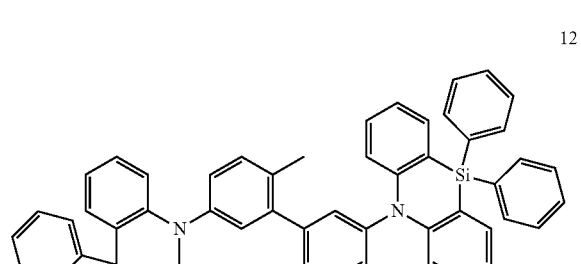
18
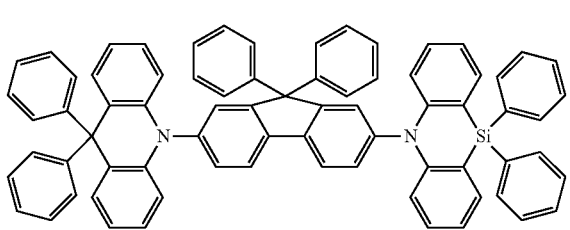

19
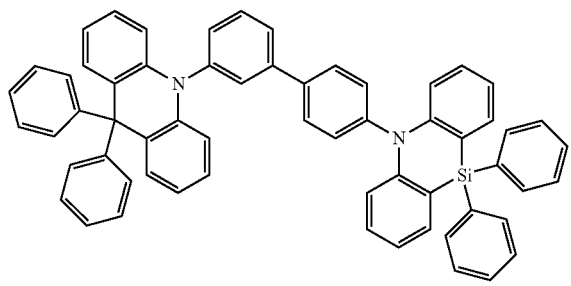
20
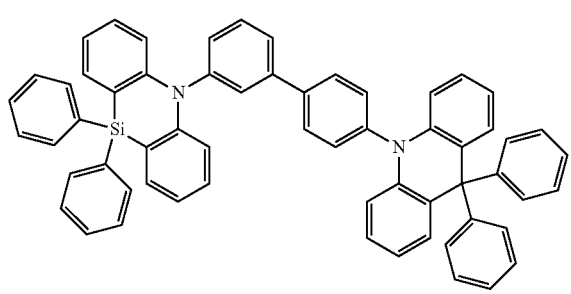
21
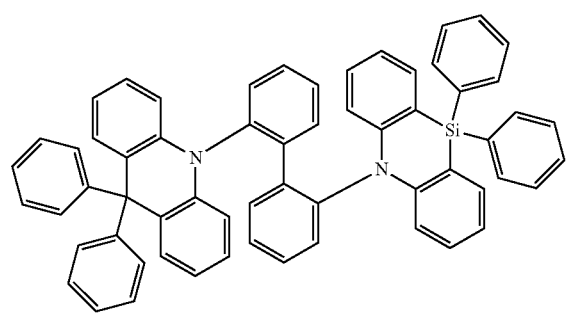
22
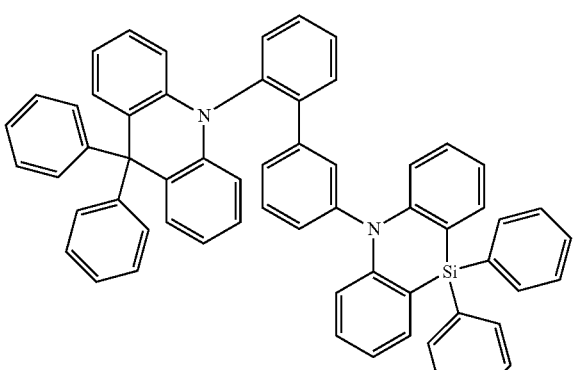
23
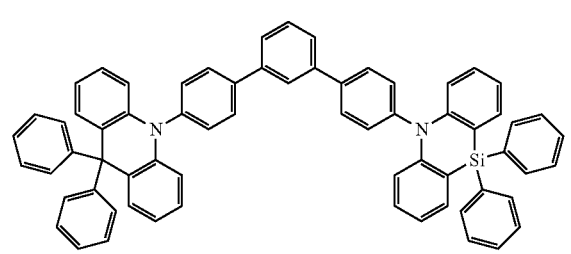
24
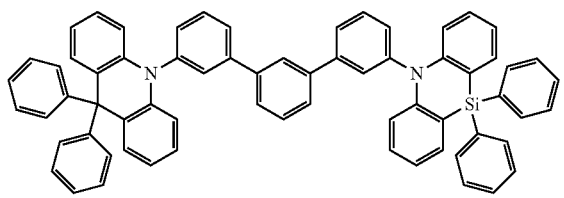
25
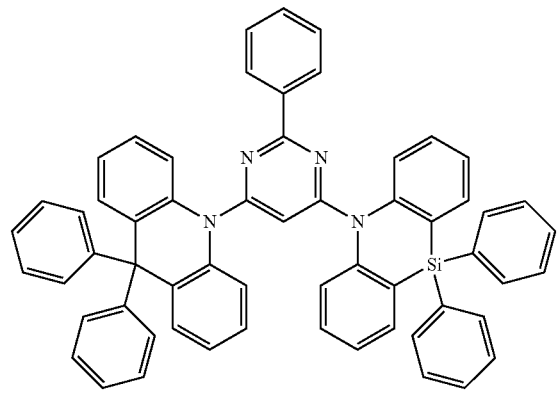
26
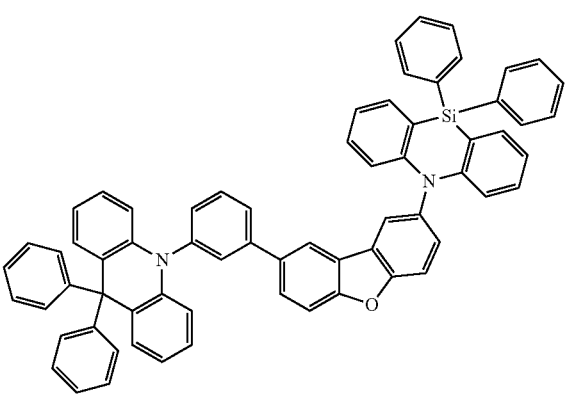
27
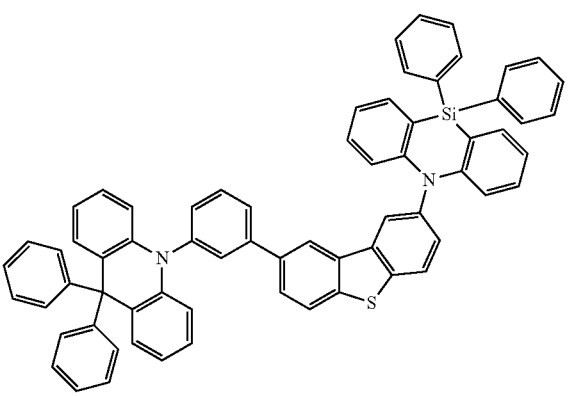

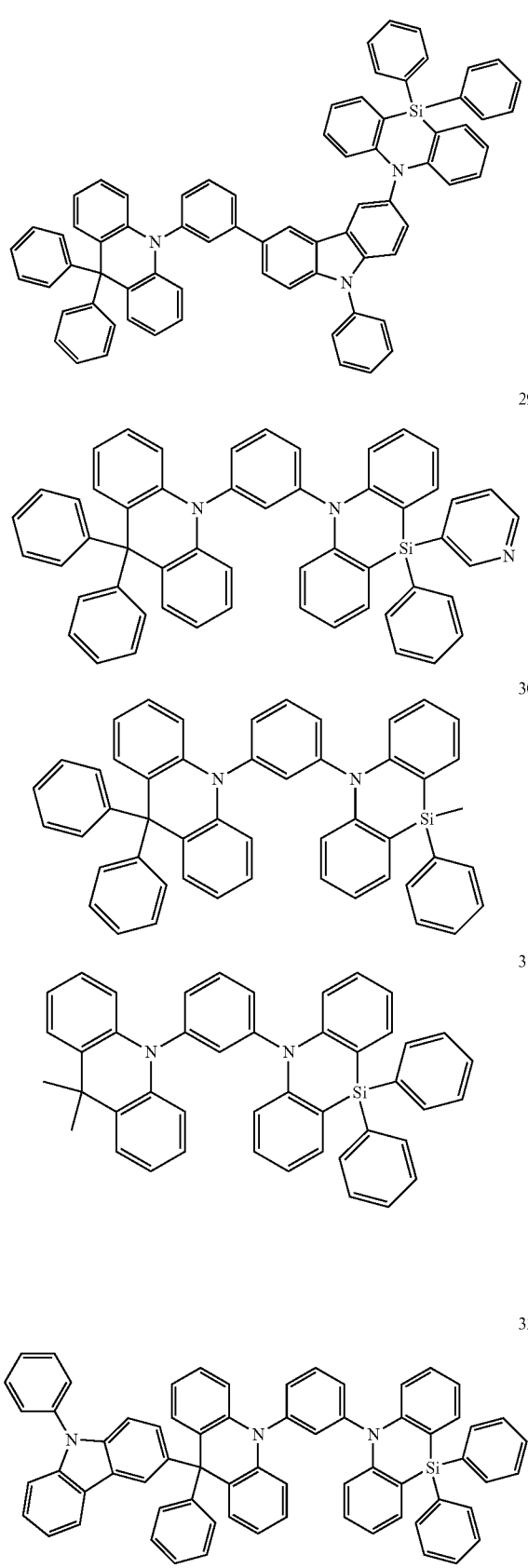
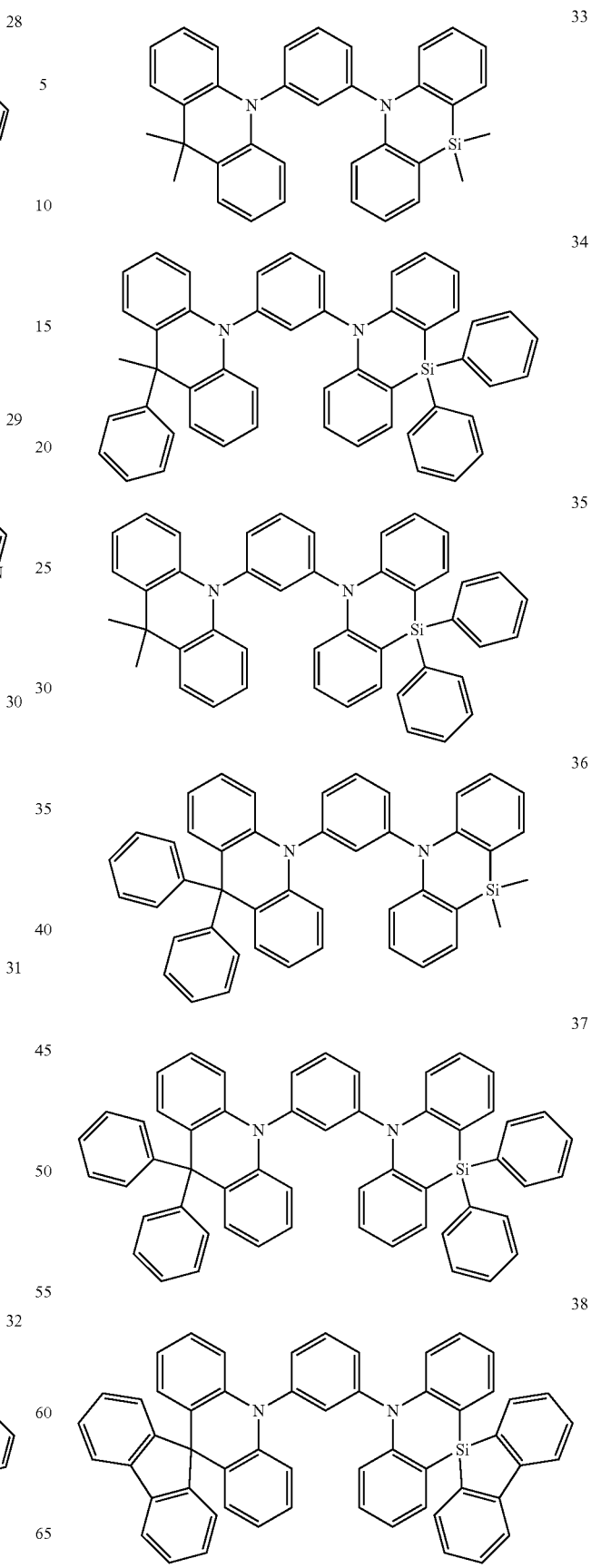

39
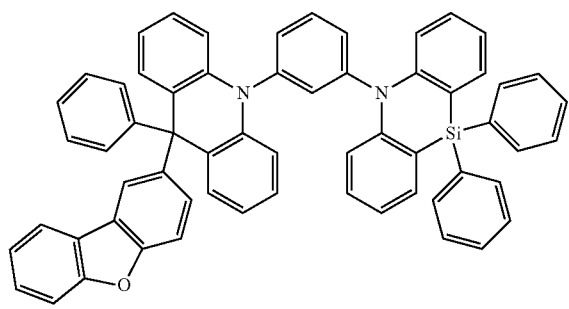
42
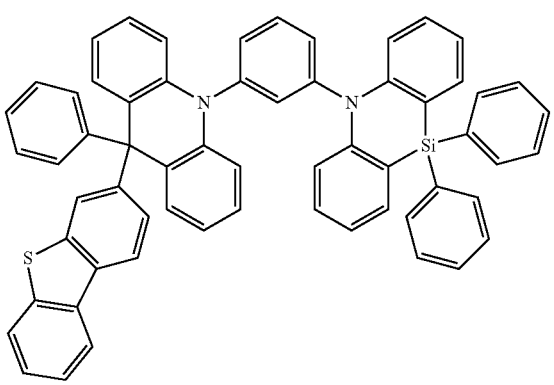
40
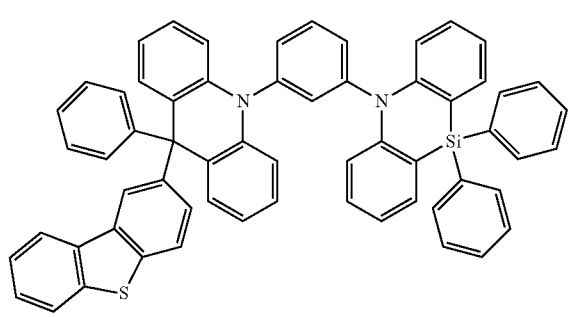
41
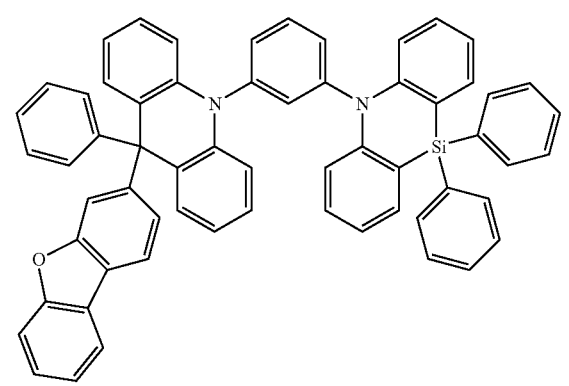
43
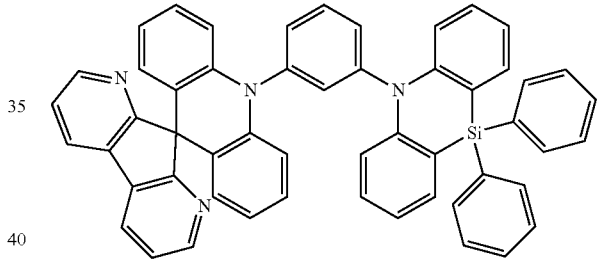
* * * * *